US012635299B1

(12) United States Patent
Anderson et al.

(10) Patent No.: US 12,635,299 B1
(45) Date of Patent: May 19, 2026

(54) METHOD OF PRODUCING A DIRECT BAND GAP IN INDIRECT BAND GAP MATERIALS AND LIGHT EMITTING OR DETECTING DEVICES FABRICATED THEREFROM

(71) Applicant: National Technology & Engineering Solutions of Sandia, LLC, Albuquerque, NM (US)

(72) Inventors: Evan Michael Anderson, Albuquerque, NM (US); Quinn Campbell, Albuquerque, NM (US); Shashank Misra, Albuquerque, NM (US); Aaron Michael Katzenmeyer, Vienna, VA (US); Jeffrey Andrew Ivie, Rio Rancho, NM (US); Scott William Schmucker, Albuquerque, NM (US); Andrew David Baczewski, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 389 days.

(21) Appl. No.: 18/418,457

(22) Filed: Jan. 22, 2024

Related U.S. Application Data

(60) Provisional application No. 63/440,493, filed on Jan. 23, 2023.

(51) Int. Cl.
*H01L 33/34* (2010.01)
*H10F 77/1223* (2025.01)
*H10H 20/826* (2025.01)

(52) U.S. Cl.
CPC ..... *H10H 20/8262* (2025.01); *H10F 77/1223* (2025.01)

(58) Field of Classification Search
CPC ........................ H10H 20/8262; H10F 77/1223
See application file for complete search history.

(56) References Cited

U.S. PATENT DOCUMENTS

| | | | |
|---|---|---|---|
| 11,674,850 B1 | 6/2023 | Goldflam et al. | |
| 2010/0295095 A1* | 11/2010 | Klipstein | H10F 30/21 |
| | | | 257/184 |
| 2019/0148450 A1* | 5/2019 | Wei | H10F 30/221 |
| | | | 257/184 |

OTHER PUBLICATIONS

Anderson, E. M. et al., "Low thermal budget high-k/metal surface gate for buried donor-based devices," Journal of Physics: Materials (2020) 3:035002, 8 pages.

(Continued)

*Primary Examiner* — Mohammed R Alam
(74) *Attorney, Agent, or Firm* — Mark A. Dodd

(57) ABSTRACT

A method for creating direct band gap material from indirect band gap material, the resultant direct band gap material, and corresponding optical devices are described. The method employs atomic layer doping (ALDo) to create closely spaced δ-doped layers, alternating between n-type and p-type dopants, to modify the band structure of the indirect band gap material. The spacing between adjacent δ-doped layers is between 1 and 100 Å. The dopants may, for example, include phosphorus, boron, and/or aluminum, while the indirect band gap material may, for example, include silicon and/or germanium. The method and material may alternatively employ a single dopant for all closely spaced δ-doped layers. This single dopant may, for example, be erbium. Optical devices, including emitters and photodetectors, may be formed of the created direct band gap material. Both vertical and lateral devices may be formed.

20 Claims, 22 Drawing Sheets

2300

(56)          References Cited

OTHER PUBLICATIONS

Gao, X. et al., "Modeling and Assessment of Atomic Precision Advanced Manufacturing (APAM) Enabled Vertical Tunneling Field Effect Transistor," 2021 International Conference on Simulation of Semiconductor Processes and Devices (SISPAD) Sep. 27-29, Dallas, TX, 5 pages.
Lu, T.-M. et al., "Path Towards a Vertical TFET Enabled by Atomic Precision Advanced Manufacturing," 2021 Silicon Nanoelectronics Workshop (SNW) Jun. 13, Kyoto, Japan, 2 pages.
Ward, D. R. et al., "All-optical lithography process for contacting nanometer precision donor devices," Applied Physics Letters (2017) 111:193101, 5 pages.

* cited by examiner

1 Angstrom Separation

4 Angstrom Separation

10 Angstrom Separation

1 Angstrom Separation

4 Angstrom Separation

10 Angstrom Separation

20 Angstrom Separation

100 Angstrom Separation

1 Angstrom Separation

20 Angstrom Separation

100 Angstrom Separation

10 Angstrom Separation

20 Angstrom Separation

100 Angstrom Separation

Delta Layer separation (Å)

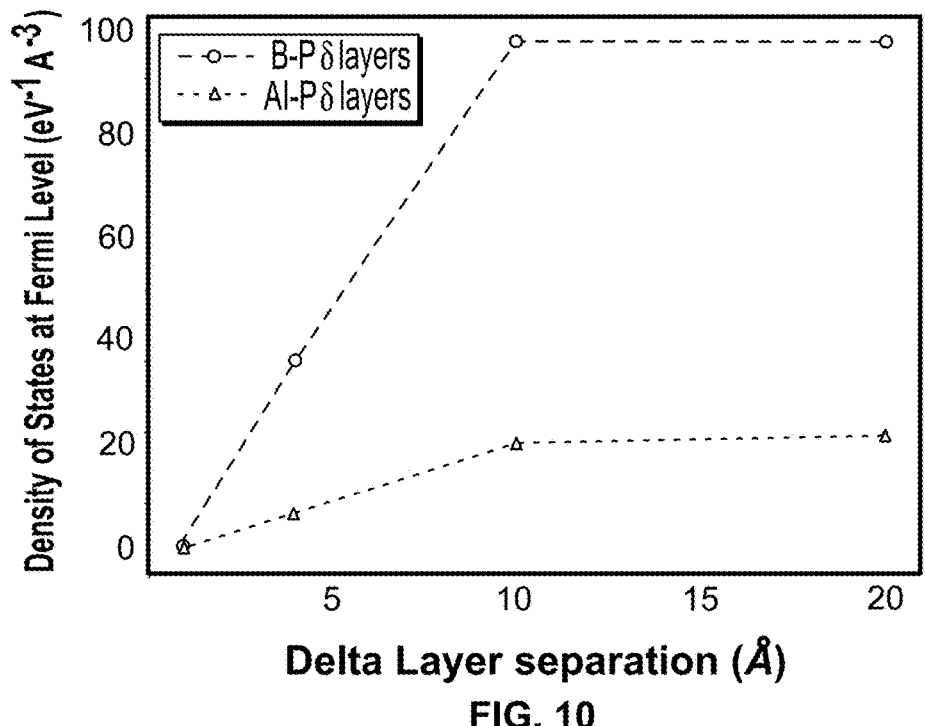
FIG. 10
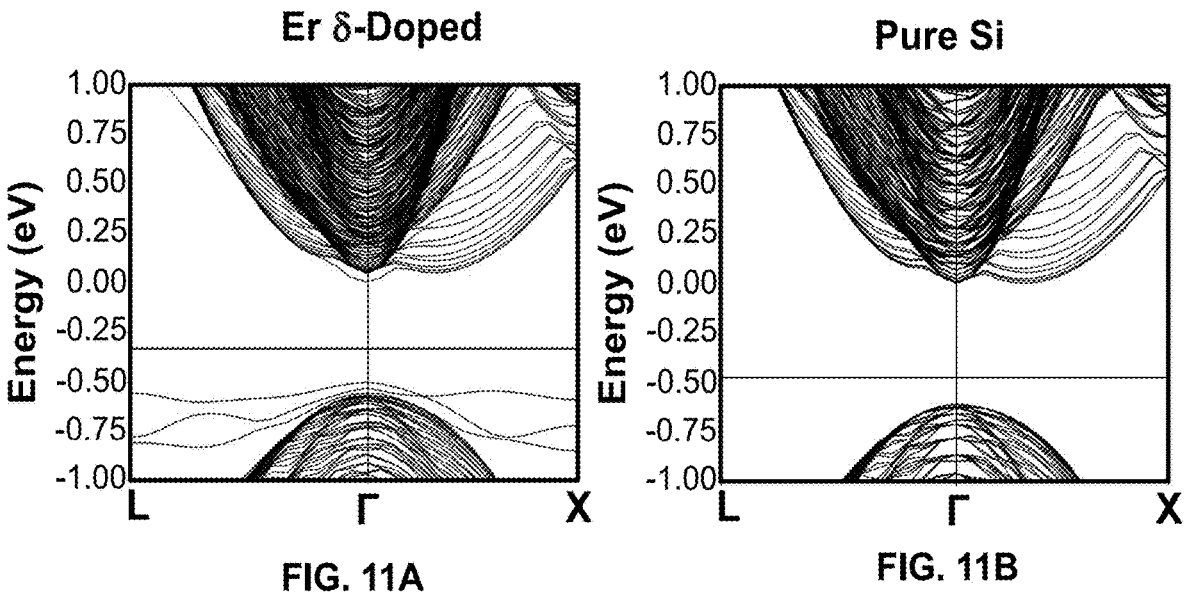
FIG. 11A                                FIG. 11B

1330

1320

1310

1300

1340

1330

1320

1310

1300

1400

1500

1600

1700

1800

1900

METHOD OF PRODUCING A DIRECT BAND GAP IN INDIRECT BAND GAP MATERIALS AND LIGHT EMITTING OR DETECTING DEVICES FABRICATED THEREFROM

CROSS-REFERENCE TO RELATED APPLICATIONS

This application claims priority to U.S. Provisional Application No. 63/440,493, filed on Jan. 23, 2023, and entitled METHOD OF PRODUCING A DIRECT BAND GAP IN ELEMENTAL SEMICONDUCTORS, the entirety of which is incorporated herein by reference.

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

BACKGROUND OF THE INVENTION

Field of the Invention

The present invention relates to a method of producing a direct band gap in materials that traditionally have an indirect band gap, a corresponding direct band gap material, and corresponding light emitting and detecting devices.

Brief Description of the Related Art

While trillions of dollars have been spent over the years developing silicon-based devices, silicon suffers from a fundamental flaw for certain applications-silicon is a semiconductor with an indirect band gap. This creates problems when a desired device requires a direct band gap. Among the devices requiring a direct band gap are optoelectronic devices, such as lasers. For this reason, lasers may be formed of direct band gap semiconductor materials, for example, many III-V and II-VI semiconductor materials have the desired direct band gap. Unfortunately, this means that fabrication of lasers cannot draw upon the full investment made for silicon-based devices.

Further, as dimensions of silicon-based devices continue to decrease, new devices are being proposed. Among these proposed devices are vertical tunnel field-effect transistors (TFETs). Research suggests that vertical TFETs, like optoelectronic devices, would benefit from manipulating silicon to create a direct band gap. Thus, the need exists for a way to tailor silicon so that it may form a direct band gap material.

SUMMARY OF THE INVENTION

One aspect of the present invention relates to the use of atomic precision advanced manufacturing (APAM) through its subprocess of atomic layer doping (ALDo) to create a direct band gap in silicon. In particular, closely spaced sheets of δ doping, alternating between n-type and p-type dopants, shows that ALDo can be used to modify the band structure of silicon to the point that direct band gap material can be formed. Modeling has shown that at least two dopant combinations, boron-phosphorous and aluminum-phosphorous, can produce the desired band gap properties. The distance between the δ-doped layers should be between 1 and 100 Å. Modeling has also shown that a single dopant, erbium, can produce a direct band gap in silicon.

In a first principle embodiment of the invention, a device comprises a layer of a first material, a first doped layer comprising a first dopant type (the first doped layer adjacent the layer of the first material), an interlayer of an indirect band gap material (the interlayer adjacent the first doped layer), a second doped layer comprising a second dopant type (the second doped layer adjacent the interlayer, the second doped layer being a δ-doped layer), a first electrical contact in contact with the first doped layer, and a second electrical contact in contact with the second doped layer, a separation between the first doped layer and the second doped layer modifying a band structure of the interlayer such that at least a portion of the interlayer becomes a direct band gap material.

In various embodiments of the first principle embodiment, the first doped layer is adjacent a first portion of the layer of the first material, the second doped layer is adjacent a second portion of the layer of the first material, and the second doped layer is laterally separated from the first doped layer by a distance; the interlayer is located between the first and second doped layers, thereby vertically separating the first doped layer from the second doped layer; both the first and second doped layers are δ-doped layers; the indirect band gap material includes carbon, germanium, silicon, and/or germanium tin; the separation is between 1 and 100 Å; and each of the first dopant type and the second dopant type is an n-type dopant or a p-type dopant and each of the n-type or p-type dopants includes aluminum, antimony, arsenic, bismuth, boron, gallium, indium, nitrogen, and/or phosphorus.

In other embodiments of the first principle embodiment, the device further comprises a second interlayer of a second indirect band gap material (the second interlayer adjacent the second doped layer), a third doped layer comprising the second dopant type (the third doped layer adjacent the second interlayer, the third doped layer being a δ-doped layer), a third interlayer of a third indirect band gap material (the third interlayer adjacent the third doped layer), and a fourth doped layer comprising the second dopant type (the fourth doped layer adjacent the third interlayer, the fourth doped layer being a δ-doped layer), thicknesses of the second and third interlayers modifying a corresponding band structure of each of the second and third interlayers such that a corresponding portion of each of the second and third interlayers becomes a corresponding direct band gap semiconductor material; the device further comprises a third doped layer comprising a third dopant type (the third doped layer located within the interlayer, the third doped layer being a δ-doped layer); and the third dopant type includes erbium or other rare earth element.

In yet other embodiments of the first principle embodiment, the device further comprises a third doped layer comprising a third dopant type (the third doped layer located adjacent a third portion of the layer of the first material, the third doped layer laterally separated from the first and second doped layers, the third doped layer being a δ-doped layer); the third dopant type includes erbium or other rare earth element; the device further comprises a dielectric layer adjacent the second doped layer and a gate adjacent the dielectric layer (the gate adapted to receive a bias and to thereby create a field in the interlayer); and the device implements a function of an optical emitter or a photodetector.

In a second principle embodiment of the invention, a device comprises a layer of a first material, a first doped layer comprising a first dopant type (the first doped layer adjacent the layer of the first material, the first doped layer being a δ-doped layer), and an interlayer of an indirect band gap material (the interlayer adjacent the first doped layer), the first doped layer modifying a band structure of the interlayer such that at least a portion of the interlayer becomes a direct band gap material.

In various embodiments of the second principle embodiment, the first dopant type includes erbium or other rare earth element; the first dopant type is one of an n-type dopant or a p-type dopant and the one of the n-type or p-type dopant includes aluminum, antimony, arsenic, bismuth, boron, gallium, indium, nitrogen, and/or phosphorus; the device further comprises a dielectric layer adjacent the interlayer and a gate adjacent the dielectric layer (the gate receiving a bias and to thereby create a gate induced carrier layer in the interlayer); the indirect band gap material includes carbon, germanium, silicon, and/or germanium tin; and the device implements a function of an optical emitter or a photodetector.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 1A is a diagram of a silicon slab supercell used to theoretically explore the impact of δ-doped layers in direct band gap silicon material in accordance with one or more embodiments of the present invention, while

FIG. 10 illustrates the calculated density of states at the Fermi level as a function of the separation between δ-doped layers in direct band gap silicon material in accordance with one or more embodiments of the present invention.

FIGS. 11A and 11B illustrate the calculated band structure for an erbium δ-doped layer, which may be employed in one or more embodiments of the present invention, and pure silicon, respectively.

DETAILED DESCRIPTION OF THE INVENTION

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

The following description of various embodiments of the invention will begin with a theoretical examination of the band structure of silicon (Si) with individual δ-doped layers of phosphorus (P), boron (B), and aluminum (Al), followed by alternating δ-doped layers of boron and phosphorous, as well as aluminum and phosphorous. These theoretical examinations show the difference between individual δ-doped layers and that the alternating δ-doped layers can be used to form a direct band gap in silicon. Use of erbium (Er) δ-doped layers is also theoretically examined. This is followed by a section describing the growth of this direct band gap silicon material.

Theoretical Basis

In the following, ab initio techniques are used to predict the band structure of interacting phosphorous and boron δ-doped layers within silicon. This technique predicts that while each δ-doped layer creates a δ potential within the band structure, as seen for isolated band structures of each, at close distances these δ-doped layers interact, lowering the height of each δ potential. These changes saturate as a function of distance, and at 100 Å separations, the material behaves as essentially two isolated δ-doped layers. Tunneling is feasible between charge carriers at the different peaks, and one can use the potential profile calculated from density functional theory (DFT) to predict the tunneling probability as a function of distance between the δ-doped layers. The tunneling probability notably stays at a higher level than would be expected for a pure 1.1 eV triangular barrier.

Figure 1A:
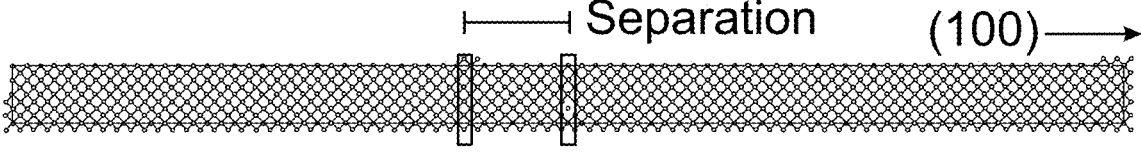

To predict the band structure of δ-doped layers, a 2×1 Si(100) slab supercell is created, as illustrated in FIG. 1A. (The horizontal axis of FIG. 1A corresponds to the [100] direction). Two δ-doped layers are placed within the silicon at ¼ monolayer coverage, though δ-doped layers may generally include greater or lesser monolayer coverage, for example, from approximately ¹⁄₁₆ to full monolayer coverage. Within a δ-doped layer, phosphorous or boron atoms are substitutionally placed within the silicon lattice. The remainder of the cell is pure crystalline silicon. This is necessarily an approximation of a more realistic atomic precision advanced manufacturing (APAM) based device, not including any other background dopants, chlorine or hydrogen atoms shed by the APAM incorporation process, or imperfect growth. It nevertheless provides a useful first approximation of material behavior for interacting δ-doped layers. The supercell is a total of 218 Å wide, and separations between the δ-doped layers of up to 100 Å are explored. Due to the periodic boundary conditions used in any plane-wave based code, there are necessarily periodic images of each δ-doped 218 Å away on either side of the [100] axis. Previous work on single δ-doped layers for both phosphorus and boron has found this distance to be sufficient separation to avoid interaction between these periodic images.

Figure 1B:
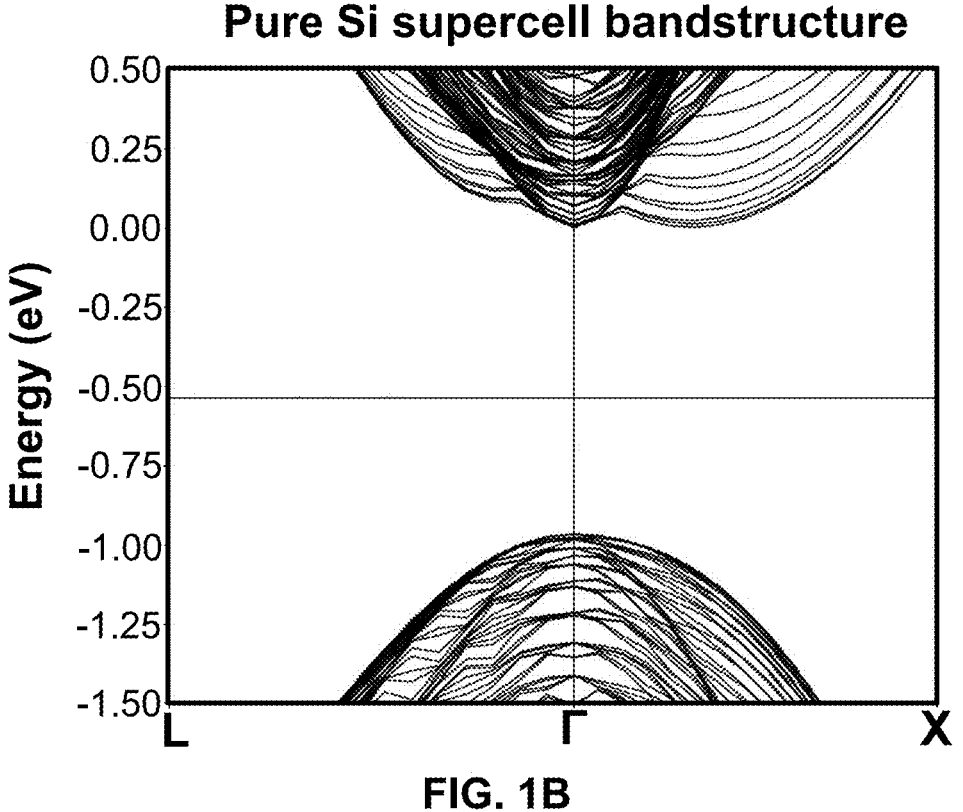
FIG. 1B illustrates the calculated band structure of pure silicon material.

All band structure calculations are done using the QUANTUM ESPRESSO package. Further, SCAN24 pseudo-potentials were used to achieve greater accuracy of the band gap. As illustrated in FIG. 1B, a band gap of 0.98 eV for a pure silicon supercell is predicted (the central horizontal line represents the Fermi level of the material). This is only slightly below the experimental value of approximately 1.1 eV and provides a much better estimate than traditional pseudopotentials. Kinetic energy cutoffs of 50 Ry and 200 Ry for the plane wave basis sets used to describe the Kohn-Sham orbitals and charge density, were used respectively. A 2×2×1 Monkhorst-Pack grid was used to sample the Brillouin zone in the initial self-consistent calculation, and then a 4×4×1 Monkhorst-Pack grid was used for non-self-consistent calculations before band structures are calculated. All energies are referenced to a zero-point set by the conduction band minimum (CBM) of any given material. Unless otherwise noted, the supercells are allowed to undergo geometric relaxation where the atoms are allowed to move until interatomic forces dip below a threshold of 50 meV/Å. The supercell size is kept fixed, mimicking the embedding of the δ-doped layer within the larger silicon material. Band structures and local density of states (LDOS) are then calculated for each material.

It should be noted that since a supercell is being used, the band structure undergoes a significant amount of Brillouin zone folding, particularly along the axis of separation. This means that features that are spatially separated within the larger band structure will appear in the same Brillouin zone space, and the CBM for silicon may appear closer to the Γ point than in a primitive unit cell.

Single δ-Doped Layers

The following explores the band structures predicted for a single boron or phosphorus δ-doped layer using the same supercell employed throughout this description. These results can be used to clearly isolate the impact of a single δ-doped layer from the interaction of the multiple δ-doped layers as described below. To facilitate easy comparison with multiple δ-doped layer predictions, the same supercell and calculation parameters are used throughout. This allows one to easily determine the impact of interaction between the two δ-doped layers. The following results are in many ways similar to previous DFT modeling of phosphorus δ-doped layers and boron δ-doped layers, but these results are the first to use SCAN pseudopotentials, which provide more accurate band gaps for semiconductors.

Figure 2:
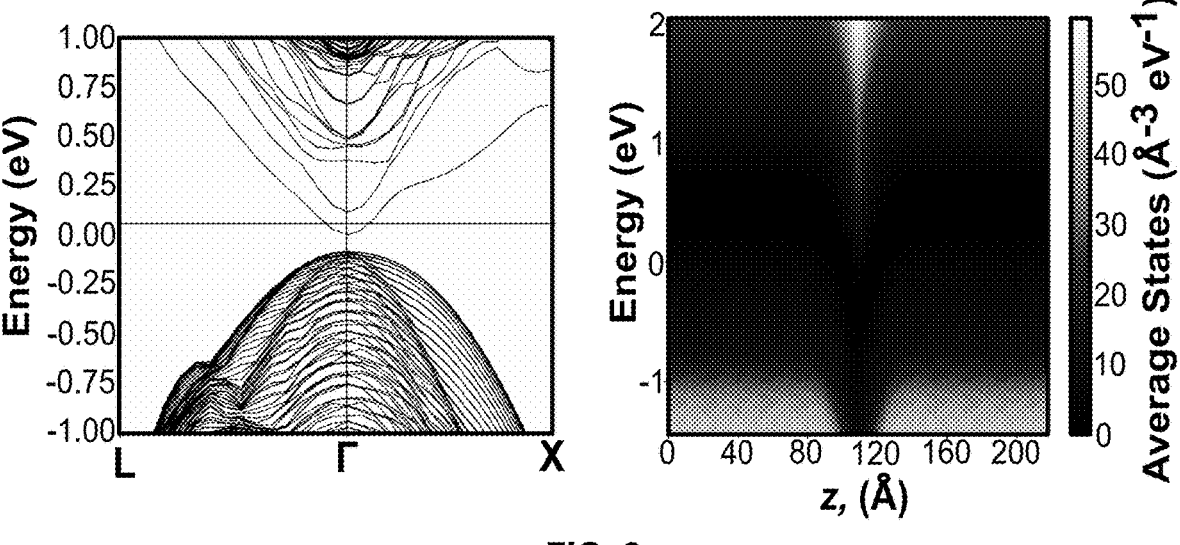
FIGS. 2, 3, and 4 illustrate the calculated band structure and localized density of states for phosphorus, boron, and aluminum δ-doped layers, respectively, which may be employed in various embodiments of the present invention.
Figure 3:
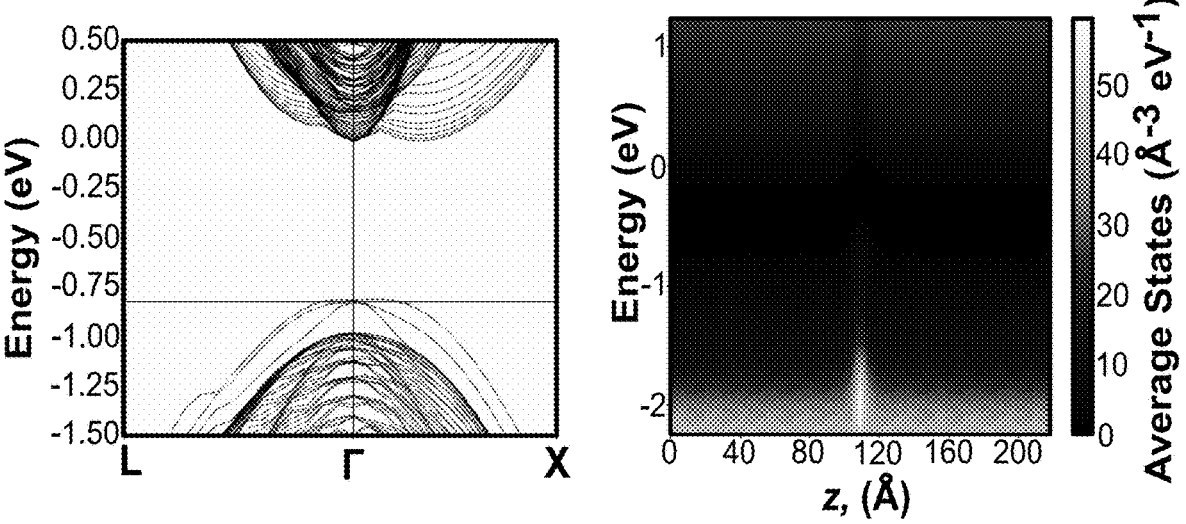
Figure 4:
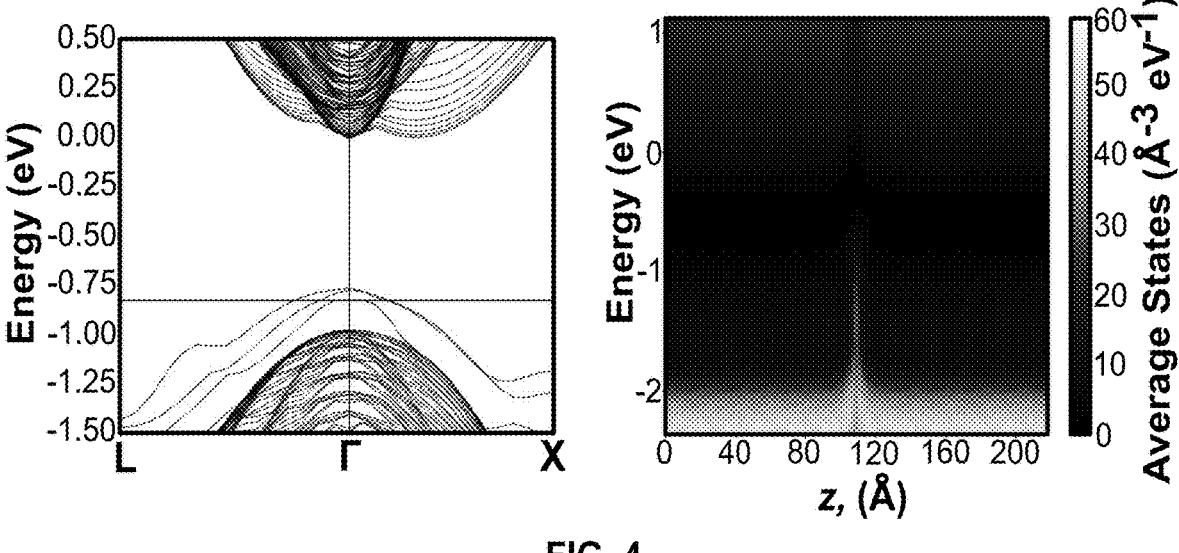

The band structure and LDOS of a phosphorus δ-doped layer, a boron δ-doped layer, and an aluminum δ-doped layer are illustrated in FIGS. 2, 3, and 4, respectively. For each material, the effects are limited entirely to the conduction band (in the case of phosphorus) or the valence band (in the case of boron). Naively, one might expect that the effects of including both a phosphorus and a boron δ-doped layer would be simply a superposition of the phosphorus conduction band and the boron valence band. This really only resembles the band structures when the δ-doped layers are separated by ≥100 Å, indicating that interaction between the δ-doped layers is indeed causing significant suppression of the bands at lower separations. It is notable that SCAN pseudopotentials predict that the δ potential induced by the phosphorus δ-doped layer is much more significant in magnitude than previous predictions. While the exact magnitude is likely an overestimate, it does indicate that phosphorus δ-doped layers should have an extremely large profile within the calculations. This indicates that the suppression of the phosphorus δ-potential at low separation distances is even more significant than it may appear at first glance. Similar overestimates are expected with respect to potentials using other dopants, resulting in greater flexibility with respect to tuning of the band structure.

Paired δ-Doped Layers

The following addresses pairs of n- and p-type δ-doped layers as a function of dopants and separation between the δ-doped layers, starting with pairs of phosphorus and boron δ-doped layers. The separation between the δ-doped layers is due to an interlayer of pure silicon.

Figure 5A:
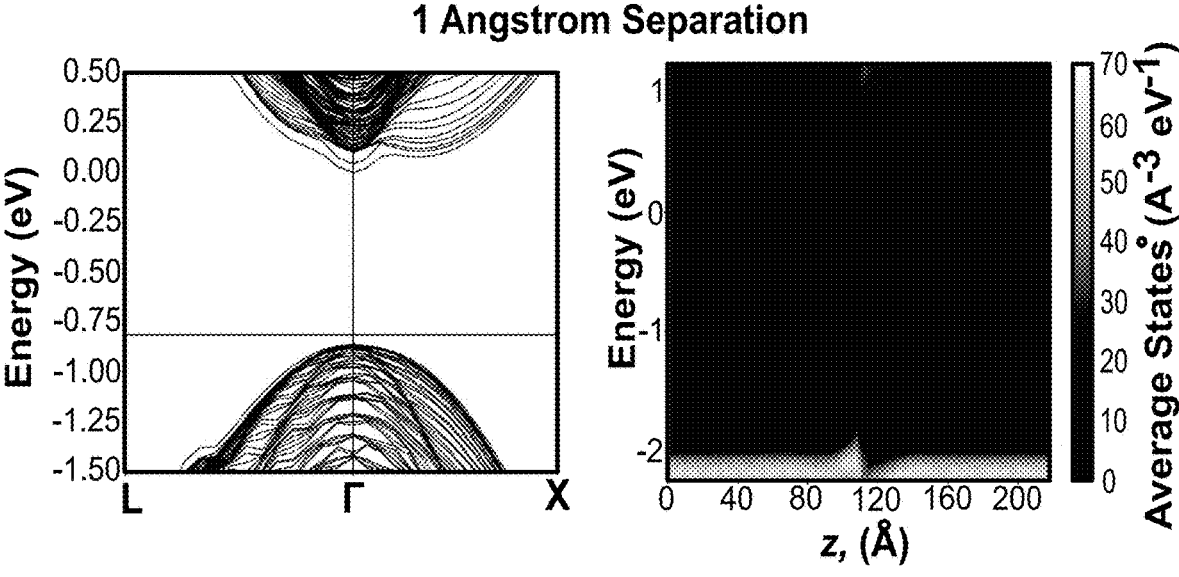
FIGS. 5A-5E illustrate the calculated band structure and localized density of states for phosphorus and boron δ-doped layers separated by 1, 4, 10, 20, and 100 Å, respectively, in direct band gap silicon material in accordance with one or more embodiments of the present invention.

The band structure of δ-doped phosphorus and boron layers separated by 1.24 Å, or just one atomic layer apart, is illustrated in FIG. 5A. At this short range, the δ-doped layers strongly suppress each other, leaving the device performing as largely silicon, albeit with a direct gap from the slight protrusion of the phosphorus δ-doped layer on the conduction bands. The band gap of the material is slightly reduced to 0.862 eV. While the band structure of the material appears uniform, one can see in the LDOS that the donor and acceptor δ potentials are slightly separated within the larger band structure. Given the strong suppression at this short separation, the δ potentials are more evoked by the shadows of triangular potentials than fully seen. Further, this separation distance is likely too small to be currently achieved experimentally.

Figure 5B:
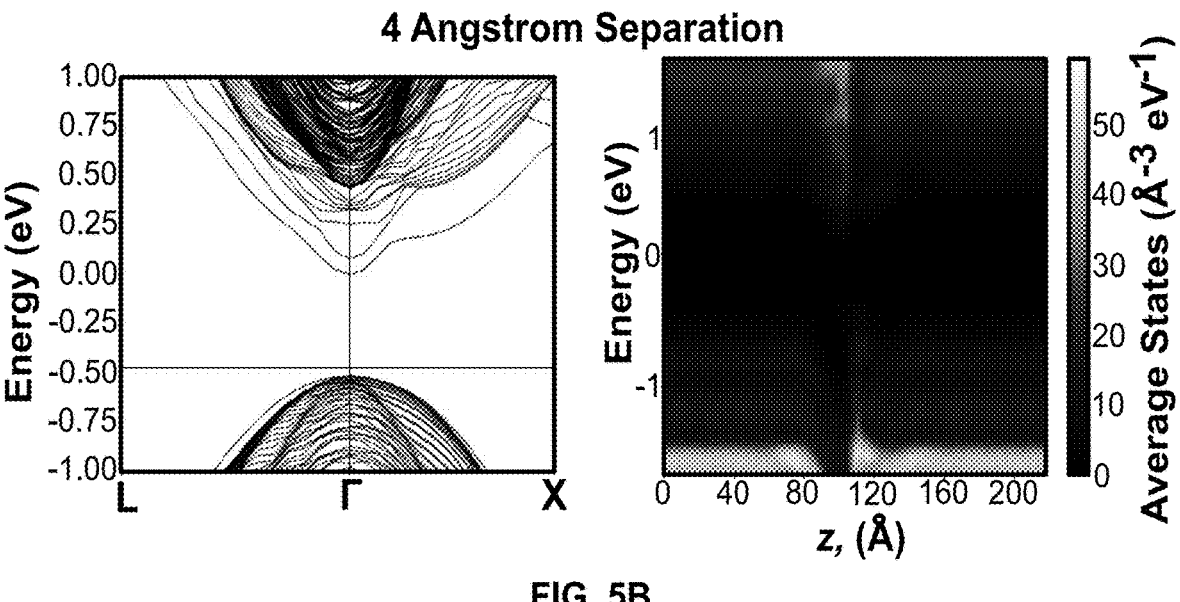

For an interlayer of silicon having a thickness of 4 Å, thereby creating a separation between the δ-doped layers of 4 Å, the δ potentials become much less suppressed, as illustrated in the band structure and LDOS in FIG. 5B. The band gap of the material is further reduced to 0.52 eV. In addition, the δ potentials are now clearly visible in the LDOS, showing a distinct protrusion for the phosphorus δ-doped layer in the conduction band, and a lower magnitude, but still distinct protrusion in the valence band from the boron δ-doped layer. It should thus be noted that while the band gap of the overall band structure is 0.52 eV, this represents a flattening of the spatially separated nature of the valence band maximum (VBM) and the conduction band minimum (CBM) in the real space LDOS. A photon incident on this material would then still have to overcome the generalized silicon band gap of approximately 1 eV to be absorbed and generate a free electron and hole at any one location. Once generated, however, these charge carriers would be highly motivated to follow the potential gradient to the nearest corresponding δ-doped layer. Note that while a separation of less than 4 Å may produce some interesting theoretical results, it is anticipated that achieving such small separations experimentally will be quite difficult.

Figure 5C:
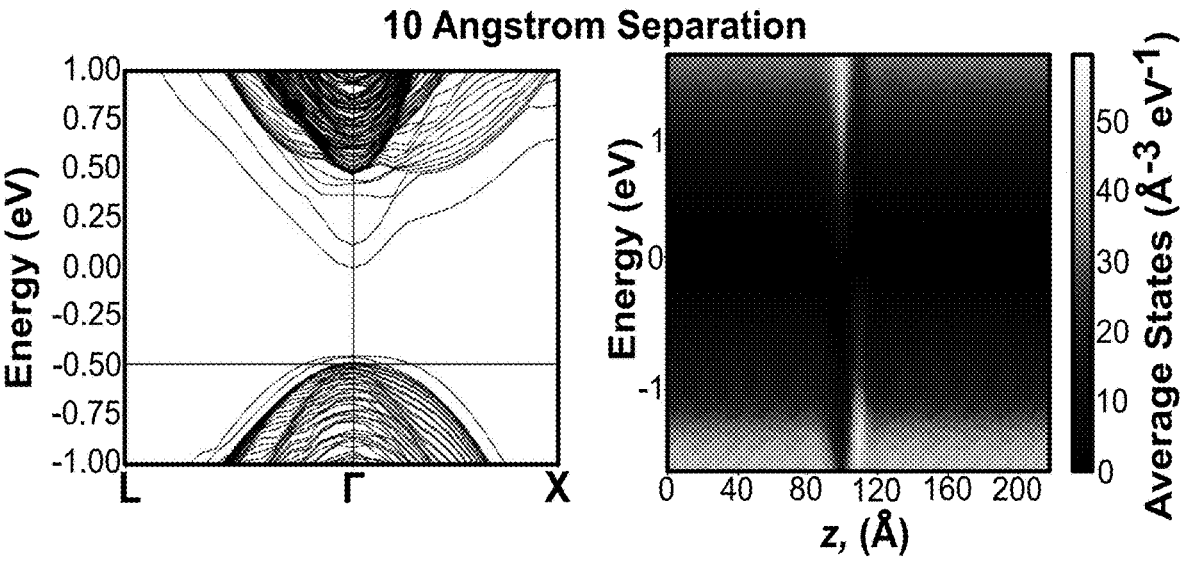
Figure 5D:
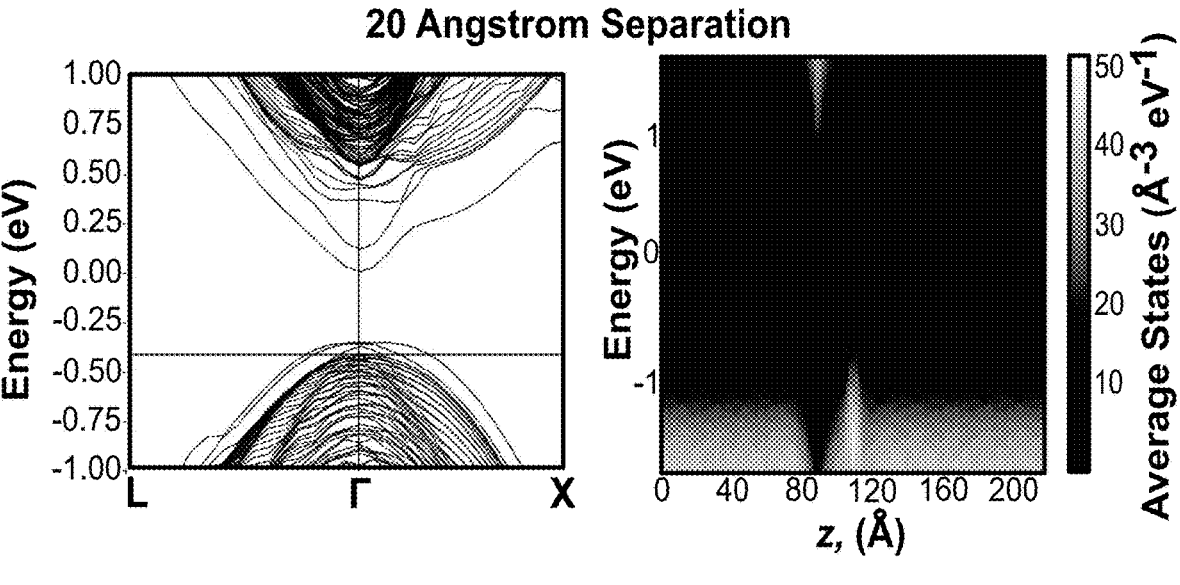

At separations of 10 and 20 Å, i.e., with interlayers of silicon having thicknesses of 10 and 20 Å, as illustrated in FIGS. 5C and 5D, respectively, the different δ-doped layers become clearly distinct. For the first time at a separation of 10 Å, the induced VBM from the boron δ-doped layer becomes clearly visible, shifting the Fermi level of the material to within the valence bands. This is reflected in a band gap of 0.45 eV at 10 Å, and clearly visible δ potentials in the LDOS in both the conduction and valence bands. This trend is continued at 20 Å, with a band gap of 0.36 eV and slightly less sharp δ potentials in the LDOS. The two δ-doped layers are still interacting and suppressing the expression of each other, but this suppression reduces with separation, thus explaining the gradually decreasing band gap.

Figure 5E:
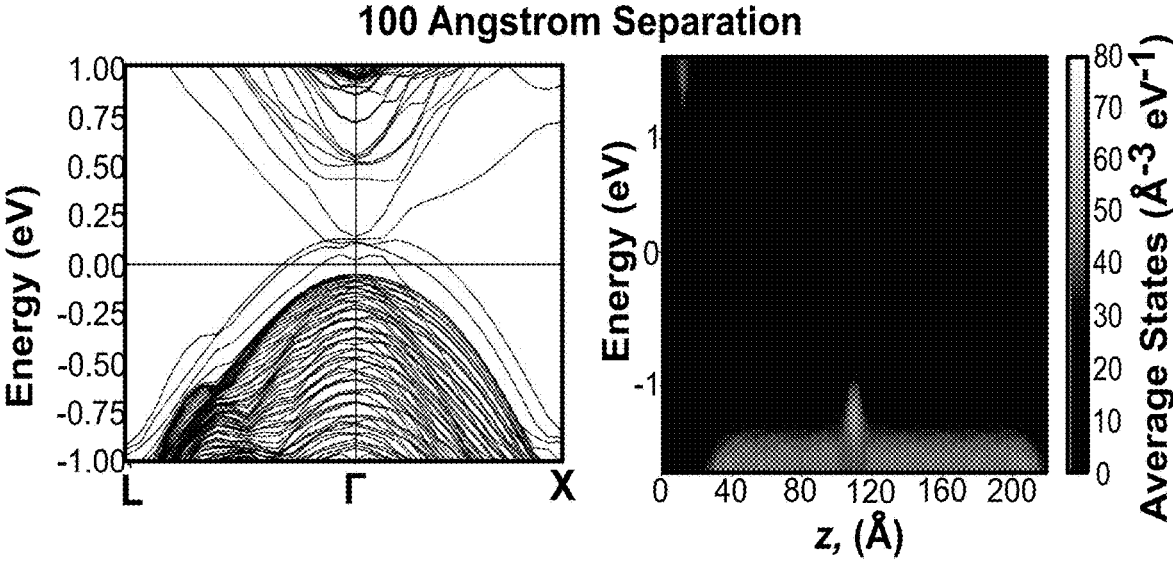
Figure 6A:
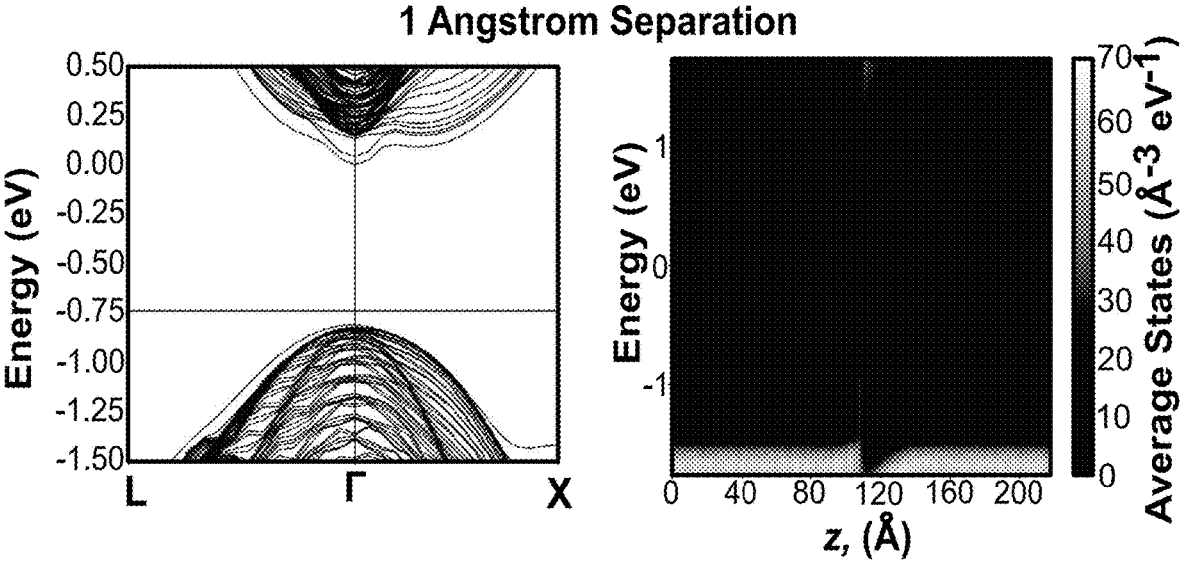
FIGS. 6A-6E illustrate the calculated band structure and localized density of states for phosphorus and aluminum δ-doped layers separated by 1, 4, 10, 20, and 100 Å, respectively, in direct band gap silicon material in accordance with one or more embodiments of the present invention.
Figure 6B:
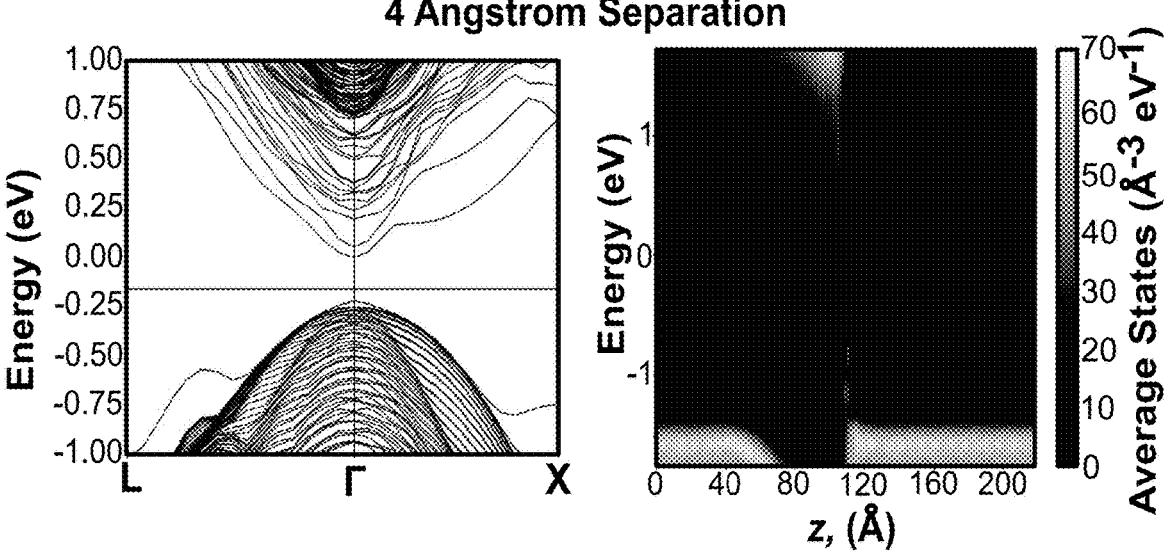
Figure 6C:
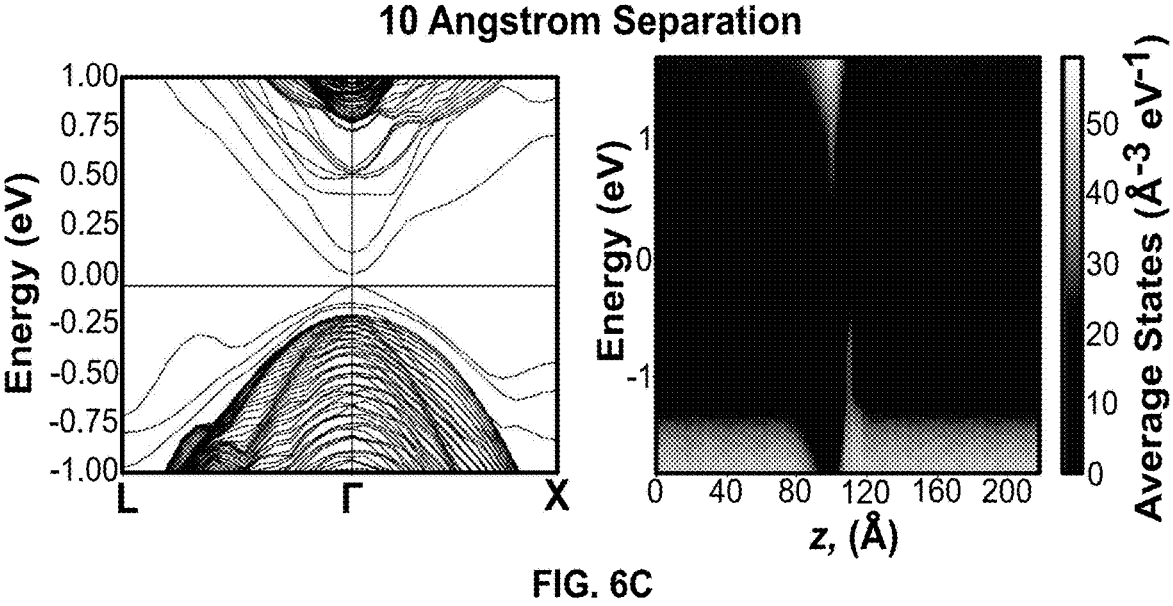
Figure 6D:
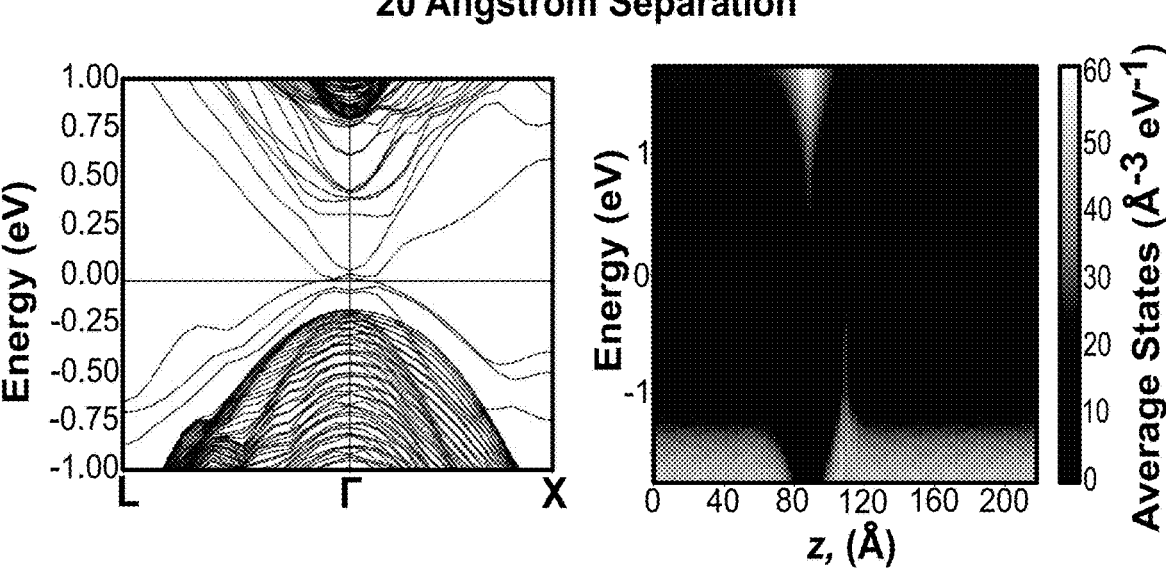
Figures 6E, 7A:
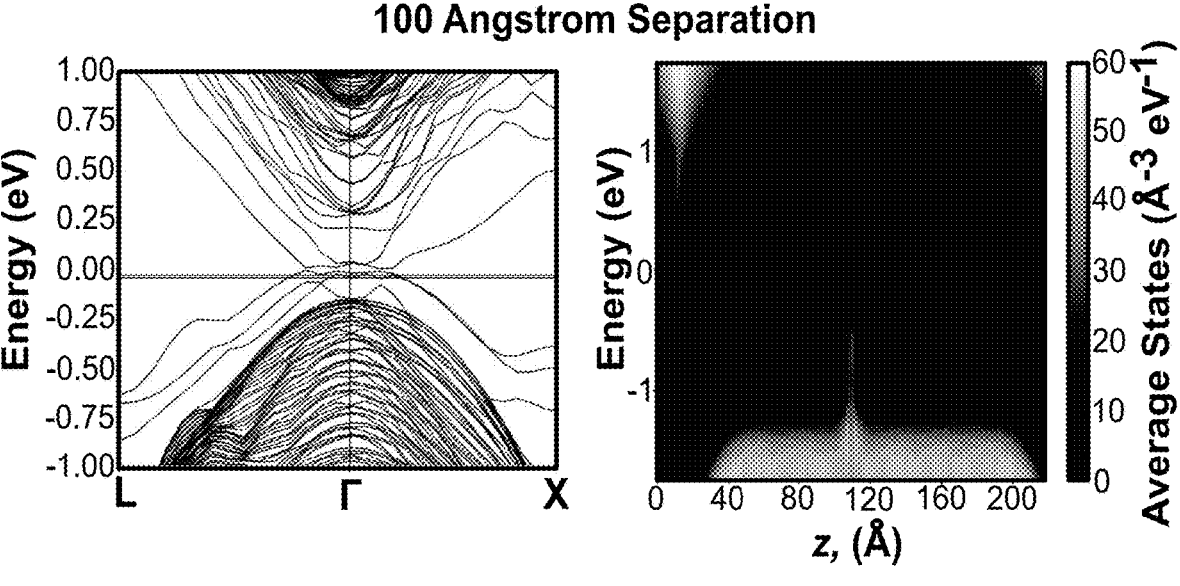
FIGS. 7A-7E illustrate the calculated band structure and localized density of states for phosphorus and boron δ-doped layers separated by 1, 4, 10, 20, and 100 Å, respectively, before and after material relaxation, in direct band gap silicon material in accordance with one or more embodiments of the present invention.
Figure 7B:
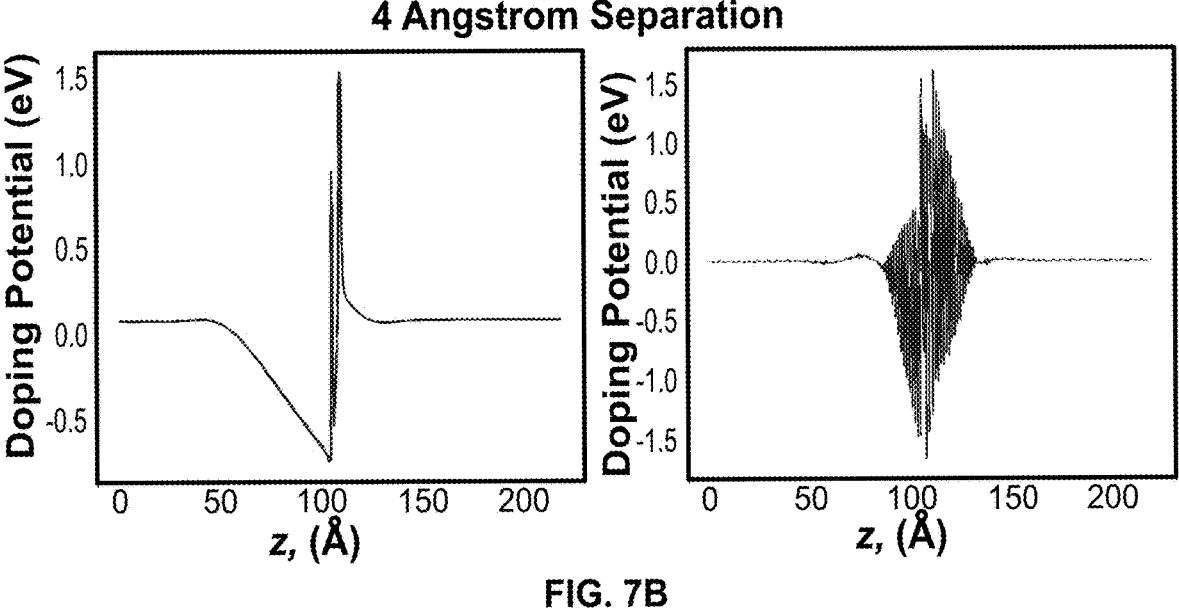
Figure 7C:
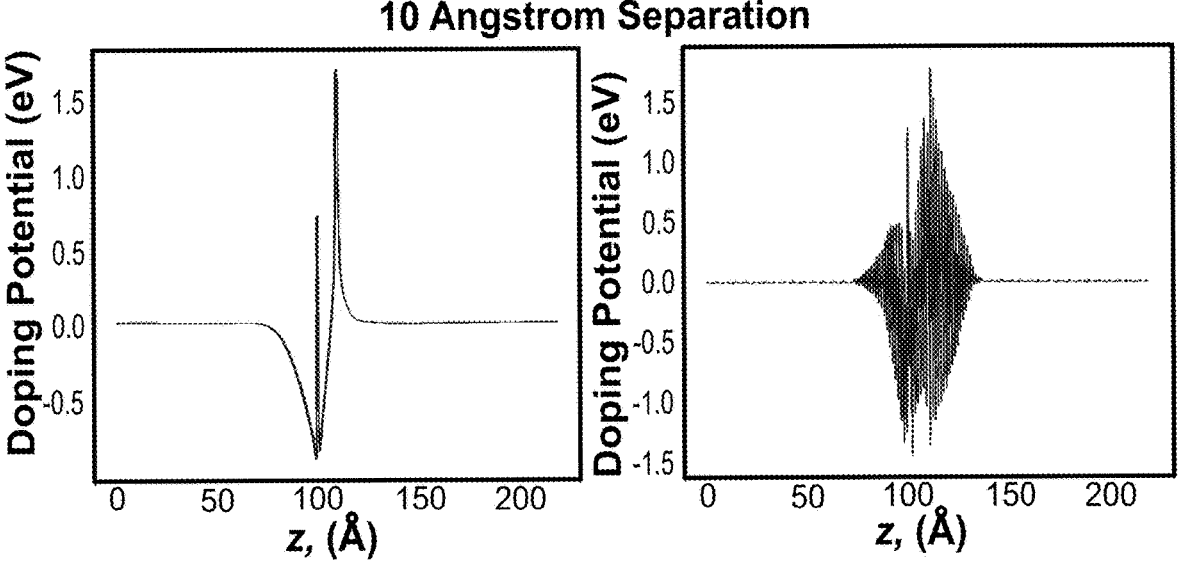
Figure 7D:
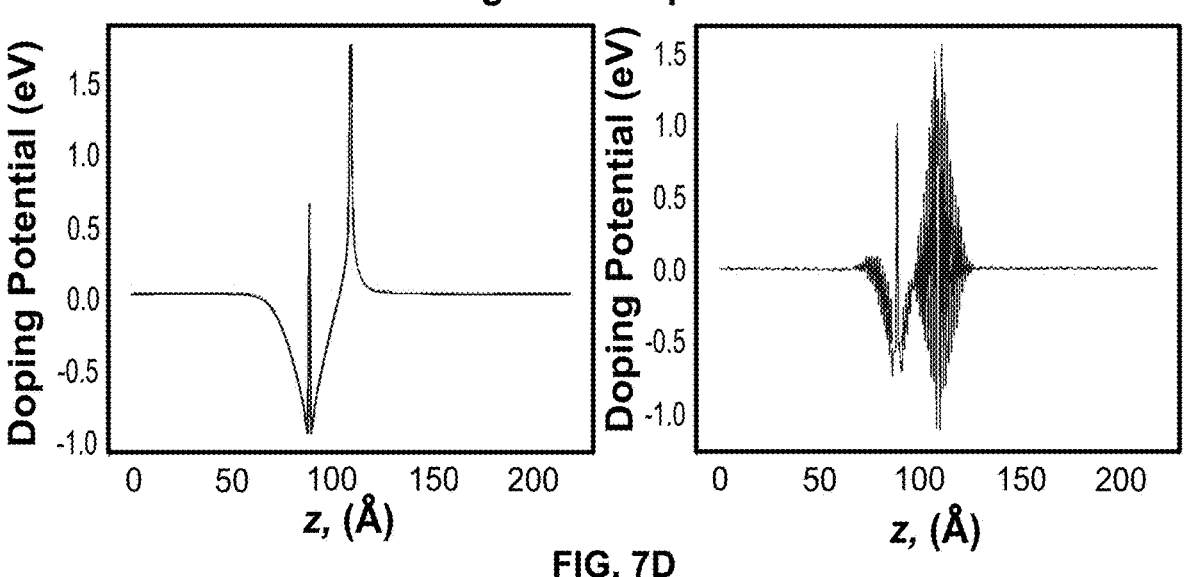
Figure 7E:
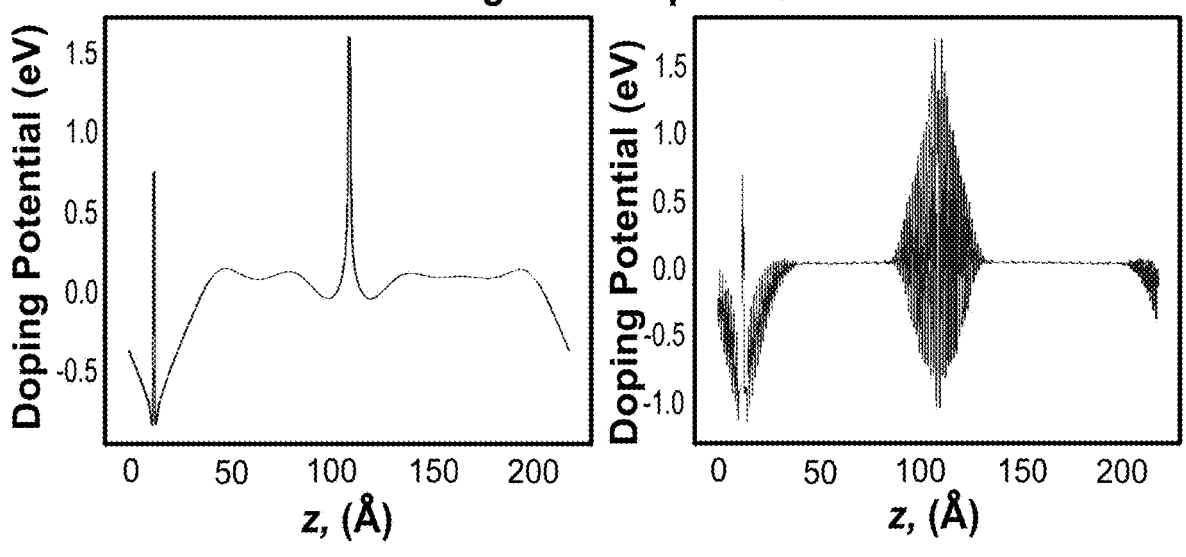
Figure 8A:
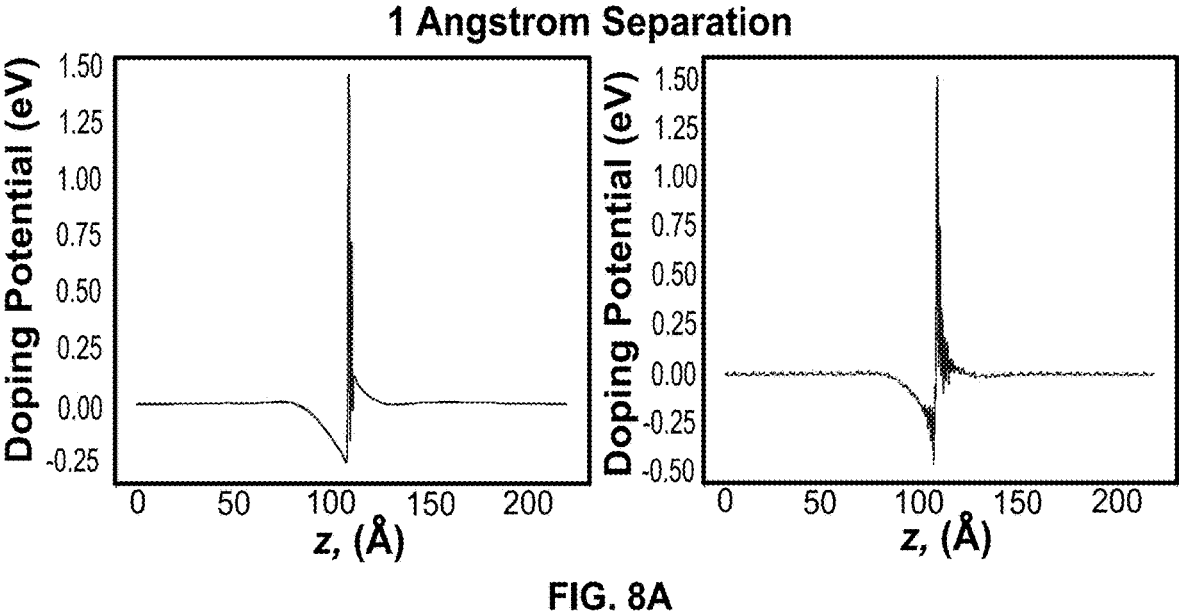
FIGS. 8A-8E illustrate the calculated band structure and localized density of states for phosphorus and aluminum δ-doped layers separated by 1, 4, 10, 20, and 100 Å, respectively, before and after material relaxation, in direct band gap silicon material in accordance with one or more embodiments of the present invention.
Figure 8B:
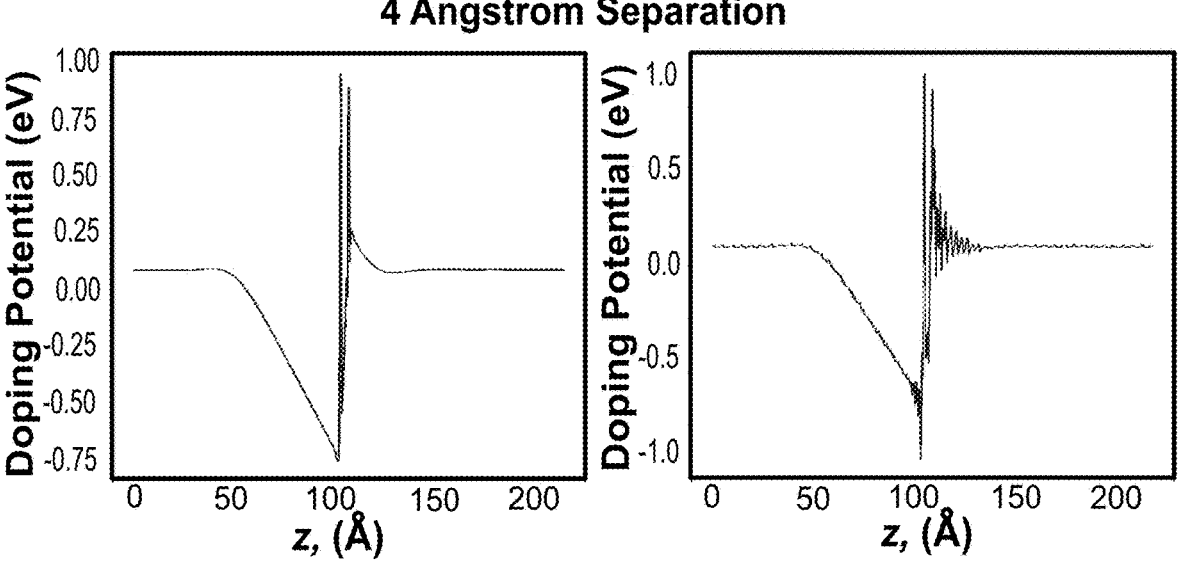
Figure 8C:
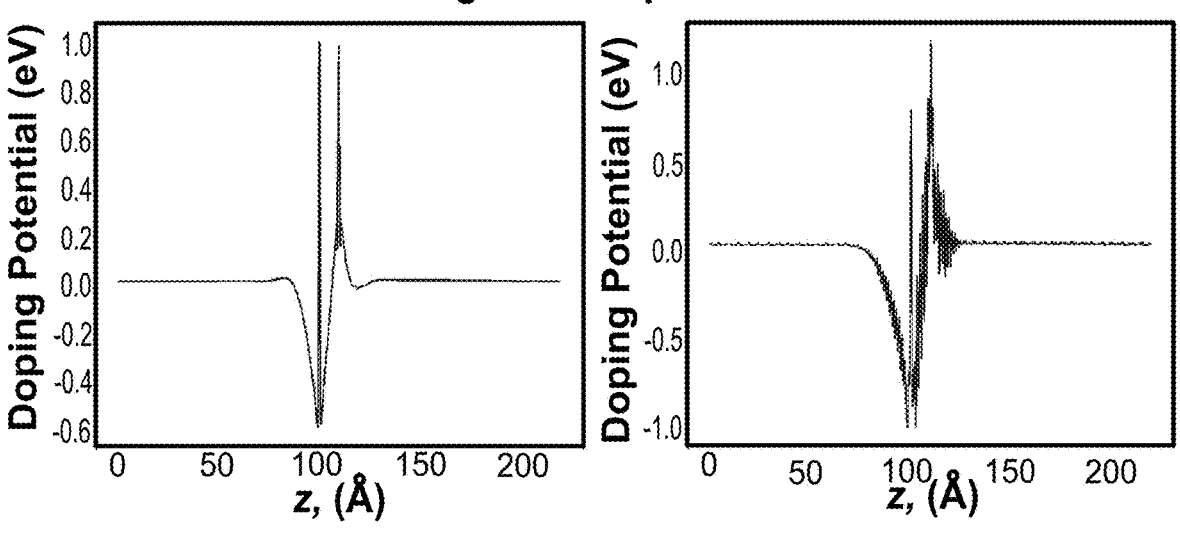
Figure 8D:
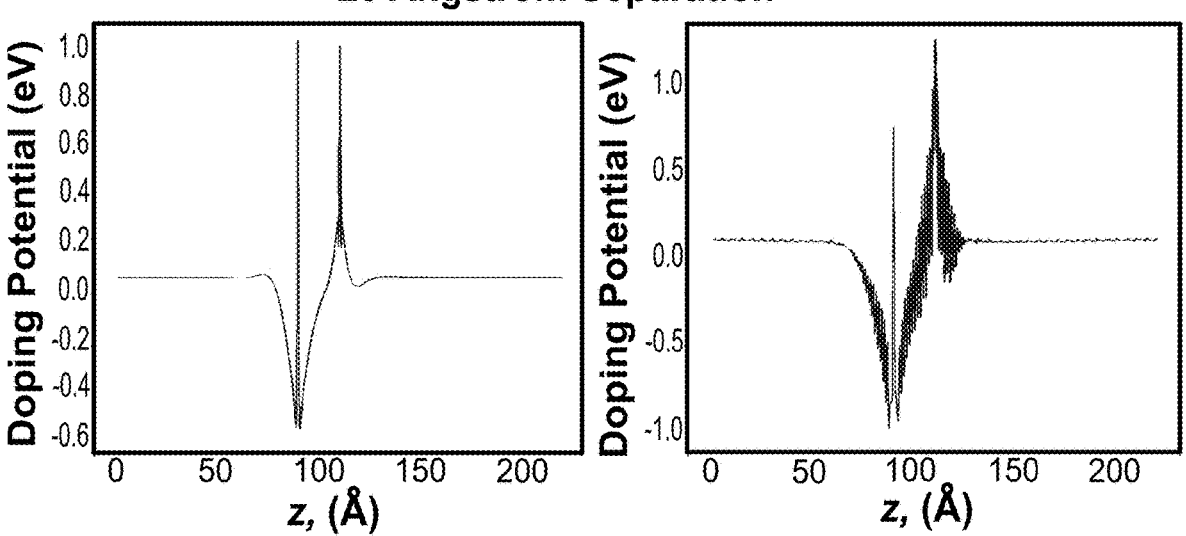
Figure 8E:
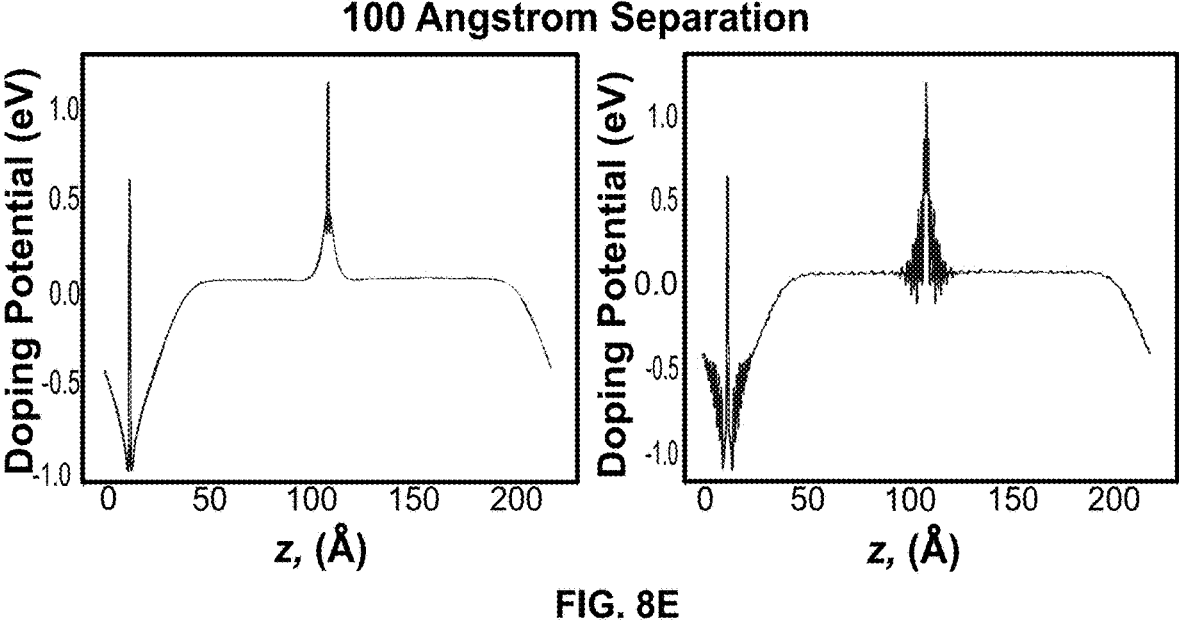

With an interlayer of silicon having a thickness of 100 Å, i.e., a distance of 100 Å, however, the two δ-doped layers are fully independent. This leads to the induced valence and conduction bands from the δ-doped layers overlapping in the middle of the band gap, as illustrated in FIG. 5E. This is in line with what one would expect from an independent phosphorus δ-doped layer with a magnitude of approximately 0.6 eV superimposed on an independent boron δ-doped layer with a magnitude of approximately 0.4 eV. It should be cautioned again, however, that while the overall band structure for this separation looks like a metal, examining the LDOS shows that the valence and conduction band peaks are spatially confined to the δ-doped layer positioning. A band gap of approximately 1 eV is maintained at any single point within the material. Note that while separations of 20 Å to 100 Å are feasible to achieve experimentally, the effect on tunneling, which is very sensitive to distance, may be difficult to accurately predict.

In addition to the use of boron as an acceptor for δ-doping a layer of silicon, aluminum has also been demonstrated as a potential dopant. How these aluminum-phosphorus materials differ relative to boron-phosphorus materials is understood by comparing FIGS. 5A-5E (boron-phosphorus materials) with FIGS. 6A-6E (aluminum-phosphorus materials), which illustrate the band structure and the LDOS of the two materials. One can see that in the aluminum-phosphorus materials, the δ-doped layer induced bands are less suppressed by the nearby layers, leading to overlapping band structures. In the next section, the doping potentials that are generated by these boron-phosphorus and aluminum-phosphorus materials are explored, showing that boron induces more stress in the surrounding silicon than aluminum does. This can be used to help explain the significantly lowered amount of suppression of the δ-doped layer induced bands. Stress from the boron δ-doped layers can lead to small atomic variation in the position of nearby silicon atoms, which can help screen the potential from the δ-doped layers from extending as far. Overall, however, these materials largely resemble the same direct band gap behavior seen in the boron and phosphorus δ-doped layer materials.

Material Stress and Relaxation

To further explore the nature of the interaction between δ-doped layers, the doping potentials for each separation distance for various materials are illustrated in FIGS. 7A-7E. These potentials are calculated by subtracting the planar averaged electrostatic potential of a pure silicon supercell from the planar averaged electrostatic potential of the material with boron and phosphorus δ-doped layers. The doping potentials calculated in the left portions of FIGS. 7A-7E represent the potential before the material is allowed to relax in response to the stress that the doping atoms induce in the material. FIGS. 7A-7E more or less follow the pattern that would be expected from the LDOS calculated in FIGS. 5A-5E. The right portions of FIGS. 7A-7E, however, illustrate the potential after the material is allowed to relax in response to stress induced by the doping atoms. These potentials have a much more oscillatory character around the δ-doped layers, which is a direct result of atomic movement in response to the strain slightly altering the periodicity of the nearby silicon atoms. These oscillations typically extend approximately 15 Å on either side of the δ-doped layers, indicating the range at which δ-doped layer induced stress can be expected to affect nearby silicon atoms. As observed by others, boron δ-doped layers feature particularly strong oscillation with the resulting δ potential being less well defined within the material compared to the phosphorus δ-doped layers. This is especially clear in the well separated materials at 20 and 100 Å separation illustrated in FIGS. 7D and 7E.

The results of similar simulations for the doping potentials of an aluminum δ-doped layer interacting with a phosphorus δ-doped layer are illustrated in FIGS. 8A-8E. As illustrated in FIGS. 8A-8E, the aluminum atoms have less suppression of the δ-doped layer induced bands compared to boron atoms, resulting in overlap even at lower separation distances.

Carrier Tunneling

Given the spatially separated nature of the δ-doped layer peaks, any charge carrier movement between the two will be dominated by tunneling through an interlayer of silicon. The cost of an electron tunneling to the opposite polarity δ-doped layer is dominated by overcoming the potential barrier induced by the interacting band structure. This tunneling probability of an electron sitting with energy E at a phosphorus δ-doped layer moving to a boron δ-doped layer through the interlayer of silicon can be calculated using:

$$T(E) \simeq \exp\left[-2\int_{Z_1}^{Z_2} |k(z)| dz\right], \qquad \text{(Eq. 1)}$$

where $z_1$ and $z_2$ are the starting and ending point of the tunneling respectively (placed at the location of each of the δ-doped layers), and $$k(z) = \sqrt{\frac{2m^*}{\hbar^2}(V(z) - E)}. \tag{Eq. 2}$$

Figure 9:
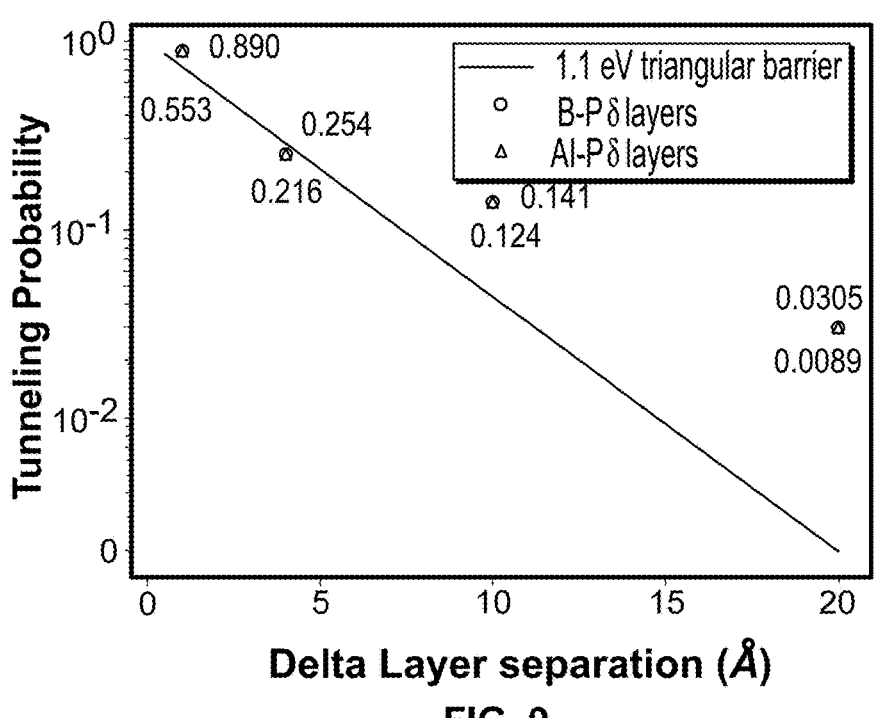
FIG. 9 illustrates the calculated tunneling probability for an electron in one δ-doped layer tunneling into an adjacent δ-doped layer as a function of the separation between the δ-doped layers in direct band gap silicon material in accordance with one or more embodiments of the present invention.

Here, $m^*$ is the effective mass of the electron, and $V(z)$ is the potential of the material as a function of the z position. One can conveniently abstract a $V(z)$ function from the DFT calculations, and numerically integrate to calculate the tunneling probability in the materials. One can then compare this to the tunneling that would be expected for a pure triangular 1.1 eV barrier, as illustrated in FIG. 9. Specifically, FIG. 9 illustrates the calculated tunneling probability for an electron in one δ-doped layer tunneling into the next δ-doped layer as a function of the separation between the δ-doped layers, i.e., through the interlayer of silicon. The tunneling probability calculated based on the actual potential measured from the DFT calculations is higher than a pure 1.1 eV triangular barrier of the same length due to the interaction between the δ-doped layers.

Notably, due to the interaction between the two δ-doped layers, the tunneling probability remains higher than would be expected for a pure triangular barrier. This trend is particularly pronounced for longer separation distances. The tunneling probabilities of boron and phosphorus δ-doped layers separated by 10 and 20 Å are calculated to be 0.141 and 0.0305, respectively. While these are not large probabilities, they are significant enough that a reasonable number of electrons may tunnel through. The tunneling rate in aluminum and phosphorus δ-doped materials are slightly lower than for boron and phosphorus δ-doped materials due to the stronger peaks induced by less relaxation of the nearby silicon. When compared on a log plot, however, these slightly smaller tunneling rates are shown to be relatively trivial departures from the boron and phosphorus case, indicating that this pattern is likely indicative of a wide range of acceptor δ-doped layers. Note that these results are before any potential bias is applied to the material, which could be used to favor higher tunneling rates. This tunneling probability calculation assumes that an electron has been excited to the conduction band of the material and is sitting at the bottom of the phosphorus δ-doped layer potential well. This electron transition could be achieved by either optical excitation or electrical bias.

The Density of States (DOS) at the Fermi level of the material gradually increases as the separation between the boron and phosphorus δ-doped layers increases, as shown in FIG. 10. At lower separations, the DOS is quite low, as the δ-doped layer induced bands are suppressed and the Fermi level is located within the band gap of the larger band structure. As the separation between the δ-doped layers increases, however, the δ-doped layer induced valence and conduction bands increase in size and the Fermi level moves from the band gap into the valence bands. This causes the DOS at the Fermi level to increase with the separation between the δ-doped layers. These higher separations are thus more likely to induce weak metallic-like behavior as electrons can easily move between bands in the valence band structure. While the aluminum-phosphorus materials have systematically lower densities of states, the trends remain the same.

It should be noted that the DFT simulations are necessarily an approximation of realistic materials with both acceptor and donor δ-doped layers. There are two aspects of the results where this approximation is especially notable. The first is in the concentration effects of using a limited DFT supercell with periodic boundary conditions, which necessarily forces the concentration of dopants being modeled to be relatively high compared to typical semiconductor concentrations. As reported by others, it can be difficult to fully disentangle the impact of a δ-doped layers from the high concentration of dopants being simulated. Nonetheless, given the agreement between experimental characterization and DFT calculations of phosphorus δ-doped layers, it is reasonable to take these DFT results as good first-order approximations of the band structure.

The second aspect of concern is unique to the current simulation of two interacting δ-doped layers: the interlayer of silicon between the two δ-doped layers. Within these DFT simulations, a perfect crystalline interlayer of silicon between the two δ-doped layers was assumed. Due to the necessary low thermal budget processing to create such a material, however, it is highly likely that this interlayer of silicon would not be perfectly crystalline and may include a significant number of defects. For example, silicon grown with APAM methods is known to contain oxygen and aluminum impurities. This imperfect interlayer of silicon and higher concentration of defects would likely reduce the interaction between the δ-doped layers. The DFT calculations should therefore be interpreted as an upper bound of how much two δ-doped regions can realistically interact as a function of separation.

Erbium δ-Doped Layer Material

Figure 12:
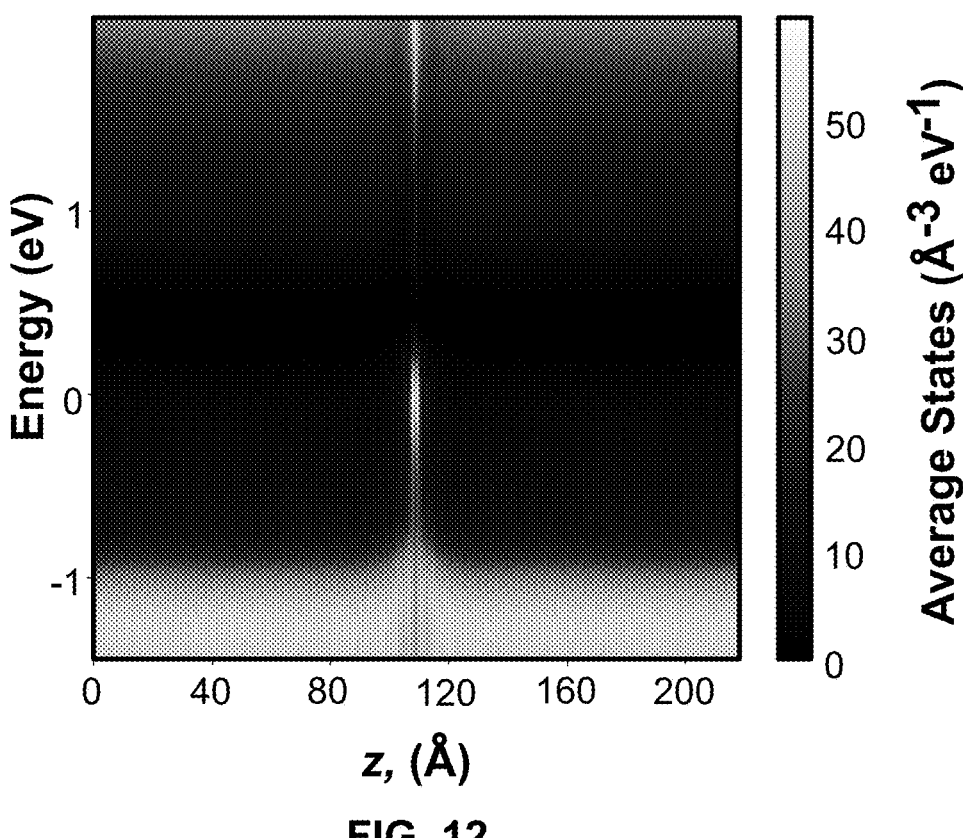
FIG. 12 illustrates the calculated localized density of states for an erbium δ-doped layer, which may be employed in one or more embodiments of the present invention.

An alternative to the above n- and p-type δ-doped layers exists that can also create a direct band gap: δ-doped layers employing the rare earth element erbium. FIGS. 11A and 11B illustrate the band structures for erbium-doped and pure silicon, respectively. Comparing FIGS. 11A and 11B, one can observe that the erbium doping creates additional states in the band gap, including at least two states from the valence band and one state from the conduction band at the Γ point, thereby creating a direct band gap. FIG. 12 illustrates the calculated LDOS for an erbium δ-doped layer, showing a large VBM component and a smaller CBM component.

Comparing these erbium δ-doped layer created states with those created by the above described n- and p-type δ-doped layers shows that the erbium δ-doped layer states are much closer to the VBM than those created by boron or aluminum δ-doped layers. This results in a wider, but still direct, band gap in the erbium δ-doped layer material. This provides one with an additional choice when a specific direct band gap energy is desired. Note that while erbium as a single dopant has been explored, other single dopants may prove feasible.

δ-Doped Material Growth

Figure 13A:
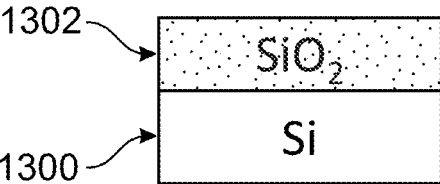
FIGS. 13A-13E illustrate the process for growing n- and p-type δ-doped layers to create a direct band gap silicon material in accordance with one or more embodiments of the present invention.
Figure 13B:
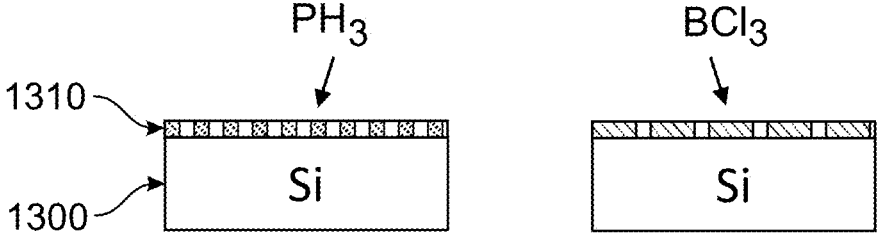
Figure 13C:
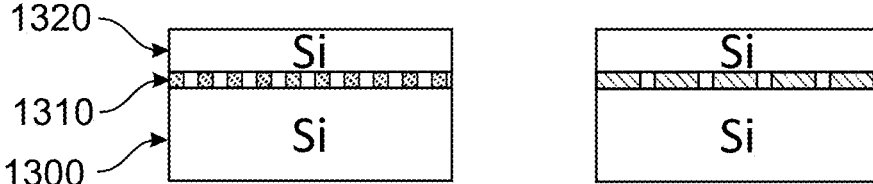

FIGS. 13A-13E illustrate the process for growing n- and p-type δ-doped layers to create a direct band gap silicon material in accordance with at least one embodiment. The process starts with a silicon substrate 1300, which will typically include a surface oxide layer 1302, as illustrated in FIG. 13A. The surface oxide layer 1302 is removed, for example, by a thermal desorption process, also known as "flashing," resulting in a clean silicon surface. Alternatively, the surface oxide layer 1302 may be removed, for example, using neon sputtering or a wet chemical etch. The clean silicon surface is then exposed to either a phosphorous source, such as phosphine ($PH_3$), or a boron source, such as boron trichloride ($BCl_3$), to grow the first δ-doped layer 1310, as illustrated in FIG. 13B. In theory, it does not matter whether the first δ-doped layer 1310 is n-type or p-type, though in practice it may be that one is found to be preferable over the other. The material may be annealed at a temperature of between approximately 200 and 450° C. after growth of the first δ-doped layer 1310. FIG. 13C illustrates the growth of a first interlayer of silicon 1320 on the first δ-doped layer 1310. The thickness of the first interlayer of silicon 1320 will be based upon the desired properties of the finished direct band gap silicon material, but as described above, will be between 1 and 100 Å to ensure proper interaction between the δ-doped layers. The first interlayer of silicon 1320 is preferably, though not necessarily, grown with the temperature of the silicon substrate 1300 between approximately 200 and 300° C.

Figure 13D:
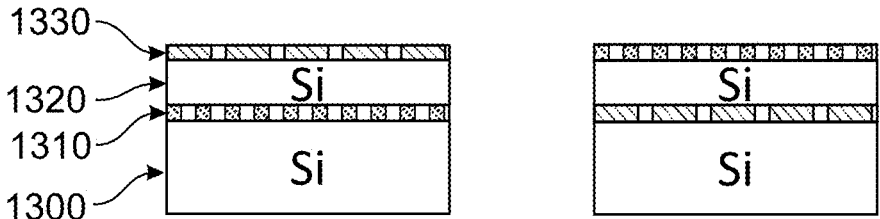
Figure 13E:
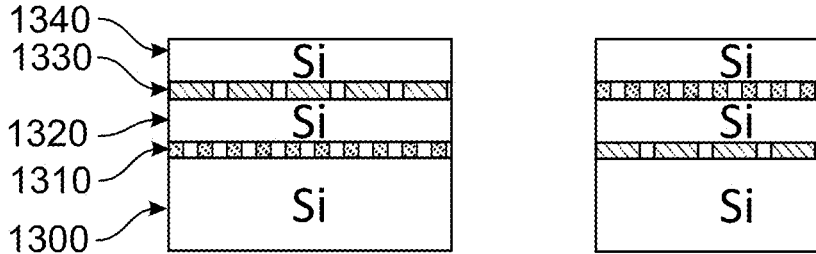

The first interlayer of silicon 1320 is then exposed to either the phosphorus or boron source to grow the second δ-doped layer 1330, as illustrated in FIG. 13D. Note that growth of the second δ-doped layer 1330 will employ the opposite of the phosphorus or boron source as that employed for growth of the first δ-doped layer 1310. The material may be annealed at a temperature of between approximately 200 and 450° C. after growth of the second δ-doped layer 1330. FIG. 13E illustrates the growth of a second interlayer of silicon 1340 on the second δ-doped layer 1330. As before, the thickness of the second interlayer of silicon 1340 will be based upon the desired properties of the finished direct band gap silicon material. The steps illustrated in FIGS. 13B through 13E may be repeated to produce the direct band gap silicon material having the desired thickness. The final growth step, not illustrated, will typically be growth of a 100 Å cap layer of epitaxial silicon, though cap layer thicknesses of between approximately 20 and 150 Å may be employed.

The just described growth process may, for example, be undertaken using molecular beam epitaxy (MBE) due to its relatively low growth temperatures. Low growth, and processing, temperatures are highly desirable to retain well-defined δ-doped layers. Higher growth, and/or processing, temperatures can lead to diffusion of the δ-doped layers, and thus loss of the direct band gap nature of the silicon material.

While the just described growth process employed phosphorus and boron sources, other embodiments may employ phosphorous and aluminum sources, while yet other embodiments may employ erbium sources.

While the above described method and resulting direct band gap material was based on the use of phosphorus, boron, aluminum, and erbium δ-doped layers, the method may be applied to other suitable dopants to likewise form direct band gap materials. Other potential dopants may, for example, include antimony, arsenic, bismuth, gallium, indium, nitrogen, and other rare earth elements.

While the above described method and resulting direct band gap material was based on the indirect band gap material silicon, the method may be applied to other indirect band gap materials to likewise form direct band gap materials. Other potential indirect band gap materials may, for example, include carbon (diamond), germanium, germanium tin, silicon carbide, and their related alloys and compounds, such as silicon germanium. Due to the wide indirect band gap of diamond (5.5 eV), the disclosed process may create a direct band gap diamond material having a wide range of potential direct band gap energies. Note that while the above description employed a substrate 1300 and an interlayer 1320 formed of the same material, other embodiments may employ different materials for the substrate 1300 and the interlayer 1320. In like manner, the cap layer need not be formed of the same material as the substrate 1300 and/or the interlayer 1320. Further, while the interlayer 1320 is an indirect bandgap material, the substrate 1300 and/or the cap layer may be formed of either an indirect band gap material or a direct band gap material.

Figure 14:
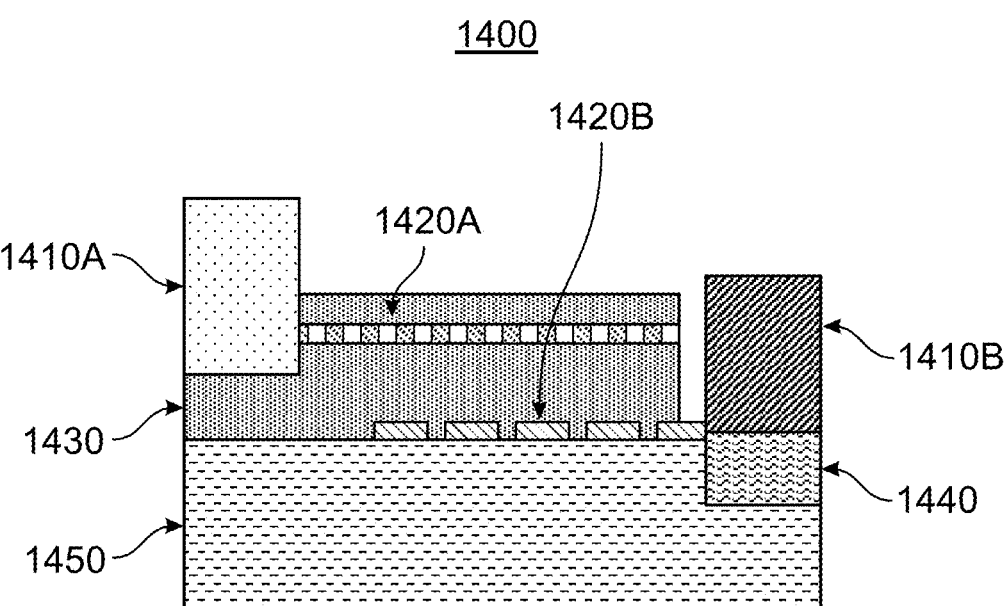
FIG. 14 illustrates an infrared emitter employing δ-doped layers in accordance with one or more embodiments of the present invention.

In at least one embodiment, the above described δ-doping concepts can be used to form a silicon-based infrared (IR) emitter 1400, illustrated in FIG. 14. The IR emitter 1400 requires injection of carriers that then recombine, thereby emitting IR radiation. To this end, independent electrical contacts 1410A, 1410B are formed to contact corresponding δ-doped layers 1420A, 1420B. In the illustrated IR emitter 1400, one of the electrical contacts 1410A is formed with a silicide process, which enables electrical contact to the boron δ-doped layer 1420A. To contact the phosphorous δ-doped layer 1420B, a portion of an interlayer 1430, formed, for example, of epitaxial silicon material, is etched away and an n-type implant 1440 is made into the underlying silicon substrate 1450 and the phosphorous δ-doped layer 1420B. The electrical contact 1410B is then deposited, making electrical contact to the n-type implant 1430 and the phosphorous δ-doped layer 1420B. Note that while not illustrated in FIG. 14, a thin portion of the interlayer 1430, having, for example, a thickness of a few nanometers, would remain covering the phosphorous δ-doped layer 1420B to keep the phosphorous δ-doped layer 1420B from oxidizing and becoming nonconductive. In various alternative embodiments, the order of the two δ-doped layers 1420A, 1420B may be swapped, i.e., the boron δ-doped layer 1420A may be the bottom layer, with the implant 1440 being p-type. Further, the silicon etch may be used to form a mesa in the interlayer 1430, to thereby define the overall IR emitter device. In yet other embodiments, dopants other than boron and/or phosphorous are employed. In still other embodiments, a conformal dielectric layer (not illustrated) may be formed on the IR emitter 1400, for example, on the top portion of the interlayer 1430 located above the boron δ-doped layer 1420A and/or within the gap between the edge of the boron δ-doped layer 1420A/interlayer 1430 and the electrical contact 1410B.

Figure 15:
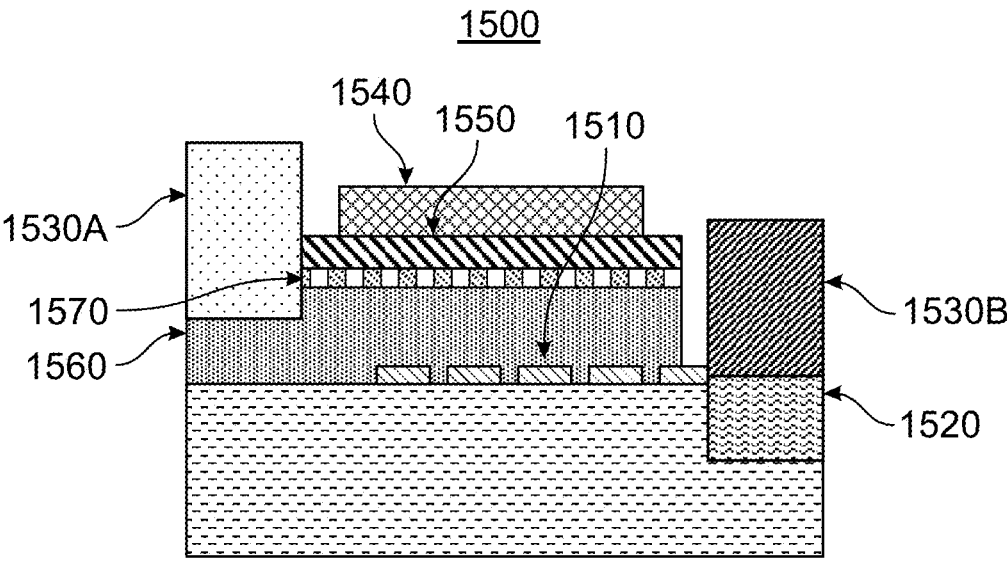
FIG. 15 illustrates a gated infrared emitter employing a δ-doped layer in accordance with one or more embodiments of the present invention.

In at least one embodiment, the above described δ-doping concepts can be used to form a gated IR emitter 1500, as illustrated in FIG. 15. The gated IR emitter 1500 includes only a single δ-doped layer 1510, doped with phosphorous in the illustrated embodiment. Electrical contact is made to the δ-doped layer 1510 as it was in the embodiment illustrated in FIG. 14, i.e., through the use of an n-type implant 1520 and a deposited electrical contact 1530B. The p-type carriers are created in the gated IR emitter 1500 by forming a gate 1540, on a dielectric layer 1550, on an interlayer 1560, formed, for example, of epitaxial silicon material in contact with a deposited metal or silicide electrical contact 1530A. As with the IR emitter 1400, a thin portion of the interlayer 1560 would remain covering the δ-doped layer 1510 to keep the δ-doped layer 1510 from oxidizing and becoming nonconductive. A gate induced hole layer 1570 would then be formed by applying a bias to the gate 1540. The structure of the gated IR emitter 1500, like that of the IR emitter 1400, may be altered in various alternative embodiments. For example, the δ-doped layer 1510 could be doped with boron, with a corresponding change to a p-type implant 1520. In this embodiment, the gate induced hole layer 1570 would become a gate induced electron layer, requiring a gate bias having the opposite polarity. In other embodiments, a conformal dielectric layer (not illustrated) may be formed on the gated IR emitter 1500, for example, within the gap between the edge of the gate induced hole layer 1570/interlayer 1560 and the electrical contact 1530B. The structure of the gated IR emitter 1500 may be easier to fabricate than that of the IR emitter 1400.

Figure 16:
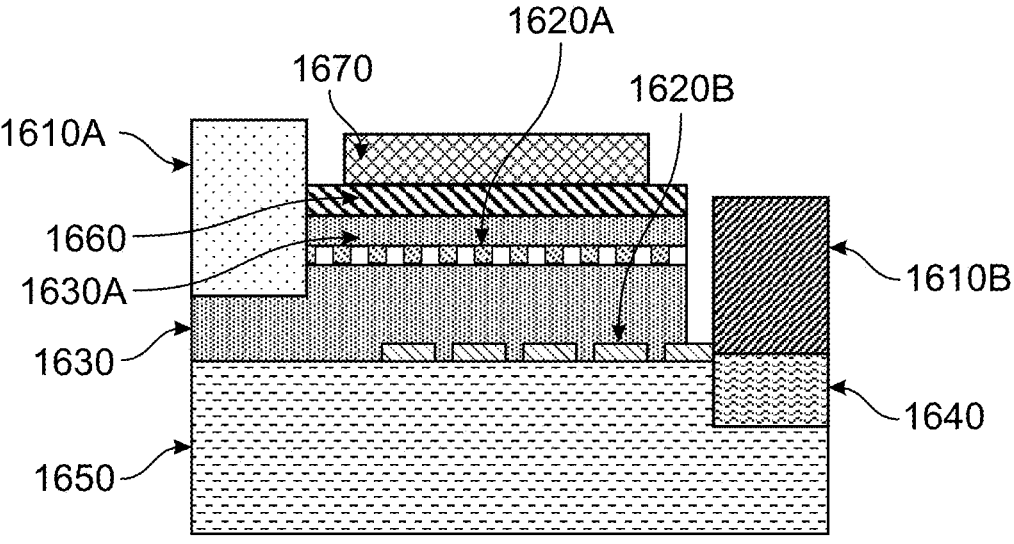
FIG. 16 illustrates a field effect infrared emitter employing δ-doped layers in accordance with one or more embodiments of the present invention.

The structures of the IR emitter 1400 and the gated IR emitter 1500 may be combined into a field effect IR emitter 1600, as illustrated in FIG. 16. The field effect IR emitter 1600 again uses independent electrical contacts 1610A, 1610B formed to contact corresponding δ-doped layers 1620A, 1620B. In the illustrated field effect IR emitter 1600, one of the electrical contacts 1610A is formed with a silicide process, which enables electrical contact to the boron δ-doped layer 1620A. To contact the phosphorous δ-doped layer 1620B, a portion of an interlayer 1630, formed, for example, of epitaxial silicon material, is etched away and an n-type implant 1640 is made into the underlying silicon substrate 1650 and the phosphorous δ-doped layer 1620B. The electrical contact 1610B is then deposited, making electrical contact to the n-type implant 1640 and the phosphorous δ-doped layer 1620B. As with the IR emitter 1400, a thin portion of the interlayer 1630 would remain covering the phosphorous δ-doped layer 1620B to keep the phosphorous δ-doped layer 1620B from oxidizing and becoming nonconductive. A dielectric layer 1660 is formed on a cap layer 1630A on the boron δ-doped layer 1620A, and a gate 1670 is then formed on the dielectric layer 1660. By applying a bias to the gate 1670, a field is formed in the interlayer 1630 that can help drive carriers from one δ-doped layer to the other. If a reverse bias applied between the δ-doped layers 1620A and 1620B is great enough, an avalanche recombination process is believed possible. In other embodiments, a conformal dielectric layer (not illustrated) may be formed on the field effect IR emitter 1600, for example, within the gap between the edge of the field effect IR emitter 1600/interlayer 1630 and the electrical contact 1610B.

Figure 17:
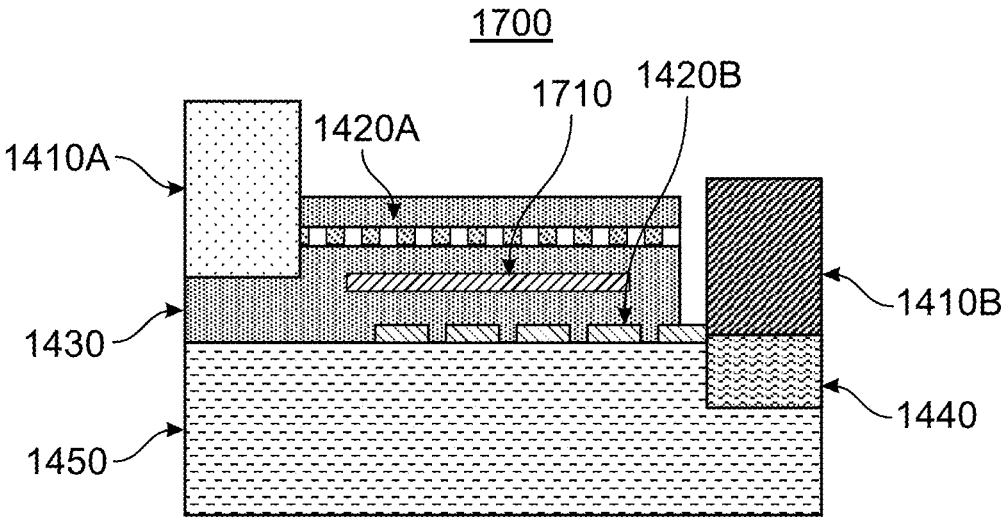
FIG. 17 illustrates an infrared emitter employing δ-doped layers in accordance with one or more embodiments of the present invention.

FIG. 17 illustrates an embodiment of an IR emitter 1700 based on the IR emitter 1400, but with an erbium δ-doped layer 1710 located between the δ-doped layers 1420A, 1420B. One may think of this as an analog to a quantum well (i.e., the erbium δ-doped layer 1710) located between electron and hole injecting barriers (i.e., the δ-doped layers 1420A, 1420B). Alternatively, the electrons and holes from the δ-doped layers 1420A, 1420B may radiatively recombine, thereby optically pumping the erbium δ-doped layer 1710, which then radiates at its own corresponding wavelength. Again, the IR emitter 1700 is subject to many of the same alternative structures described above with respect to the IR emitter 1400, the gated IR emitter 1500, and/or the field effect IR emitter 1600.

Figure 18:
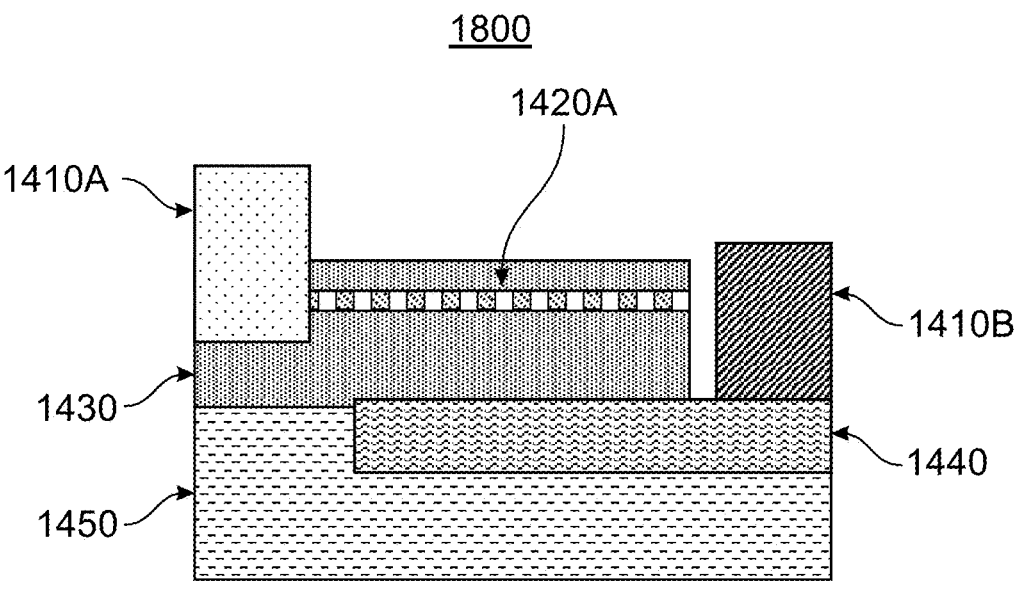
FIG. 18 illustrates an infrared emitter employing a δ-doped layer in accordance with one or more embodiments of the present invention.

FIG. 18 illustrates an IR emitter 1800, which is a variation of the IR emitter 1400 illustrated in FIG. 14. Specifically, the phosphorous δ-doped layer 1420B has been replaced by a laterally extended n-type layer 1440 prior to growth of the interlayer 1430. The laterally extended n-type layer 1440 may be formed using any suitable method, including, for example, implantation, diffusion doping, or as a doped as-grown layer.

Figure 19:
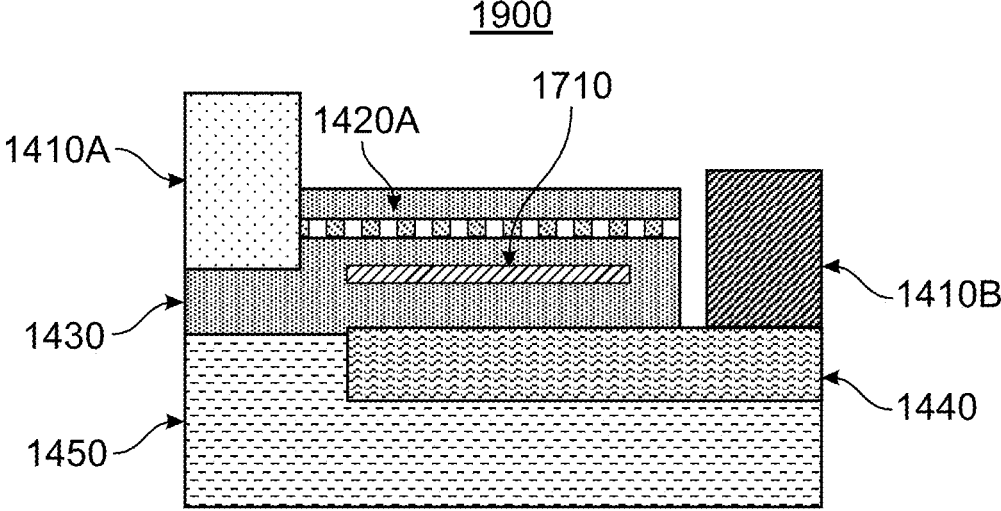
FIG. 19 illustrates an infrared emitter employing δ-doped layers in accordance with one or more embodiments of the present invention.

FIG. 19 illustrates an IR emitter 1900, which is a variation of the IR emitter 1800 illustrated in FIG. 18. Specifically, an erbium δ-doped layer 1710, like that illustrated in FIG. 17, is located between the laterally extended n-type 1440 and the δ-doped layer 1420A.

Figure 20:
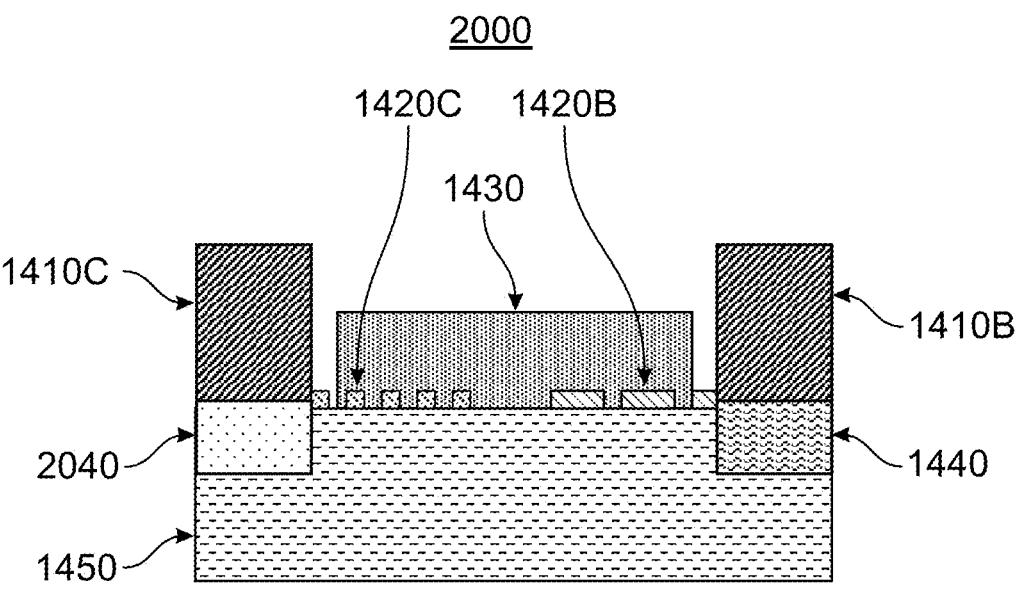
FIG. 20 illustrates a lateral infrared emitter employing δ-doped layers in accordance with one or more embodiments of the present invention.

FIG. 20 illustrates a lateral IR emitter 2000, in that the two δ-doped layers 1420B (phosphorus), 1420C (boron) are separated laterally with respect to each other by a distance D, as opposed to vertically, such as in the IR emitter 1400 illustrated in FIG. 14. The distance D is such that a portion of the interlayer 1430 between the two δ-doped layers 1420B, 1420C becomes a direct bandgap material. The distance D may, for example, be between approximately 1 Å and 100 Å. To make electrical contact to the boron δ-doped layer 1420C, a p-type implant 2040 is made into the underlying silicon substrate 1450 and the boron δ-doped layer 1420C.

Figure 21:
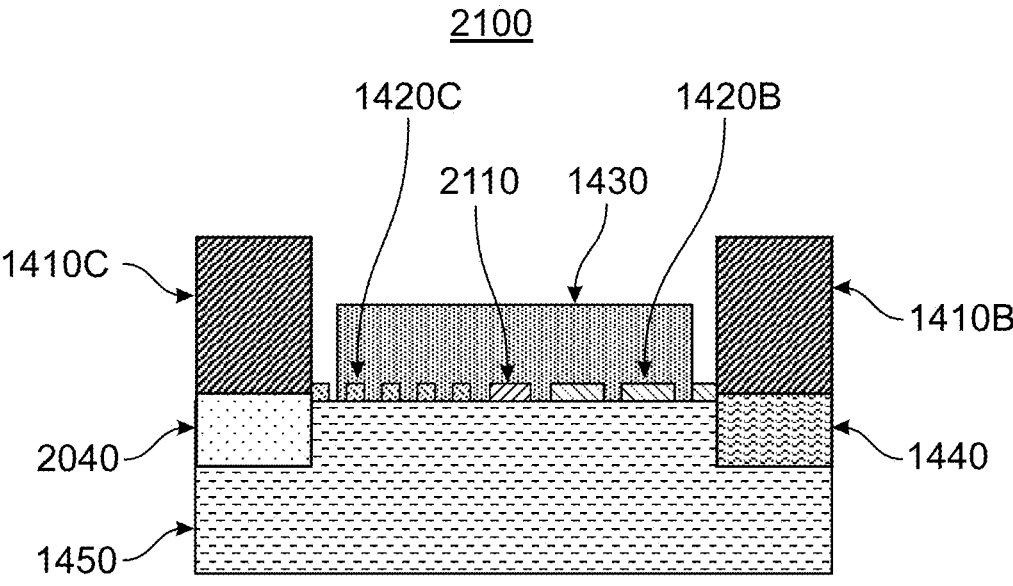
FIG. 21 illustrates a lateral infrared emitter employing δ-doped layers in accordance with one or more embodiments of the present invention.

FIG. 21 illustrates a lateral IR emitter 2100, which is a variation of the lateral IR emitter 2000 illustrated in FIG. 20. Specifically, an erbium δ-doped layer 2110 is located between the two δ-doped layers 1420B, 1420C. As with the lateral spacing between the two δ-doped layers 1420B, 1420C in the lateral IR emitter 2000, the lateral spacing between the two δ-doped layers 1420B, 1420C and the erbium δ-doped layer 2110 is such that a portion of the interlayer 1430 between the two δ-doped layers 1420B, 1420C becomes a direct bandgap material.

Figure 22:
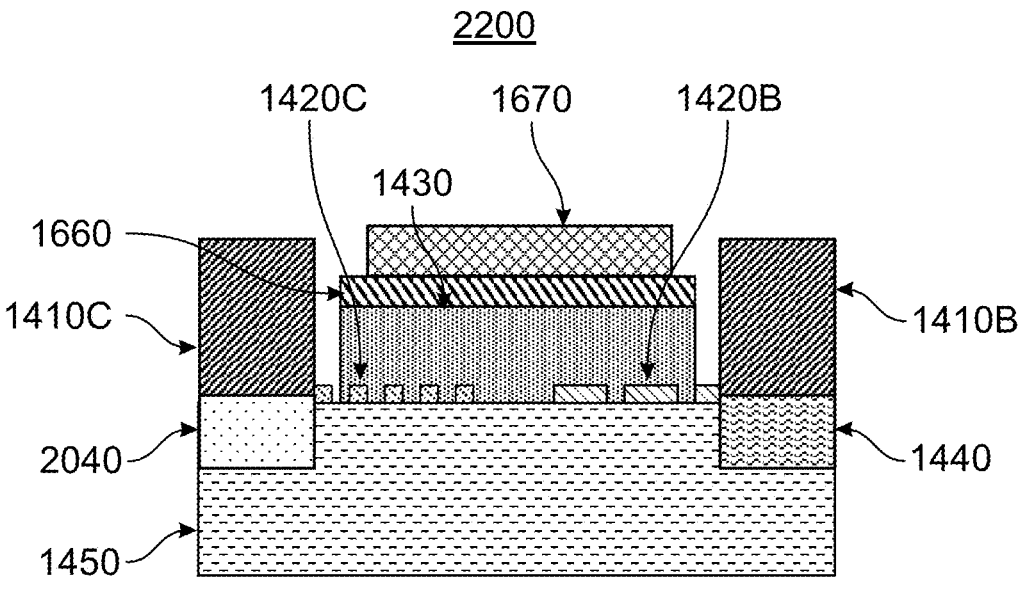
FIG. 22 illustrates a lateral gated infrared emitter employing δ-doped layers in accordance with one or more embodiments of the present invention.
Figure 23:
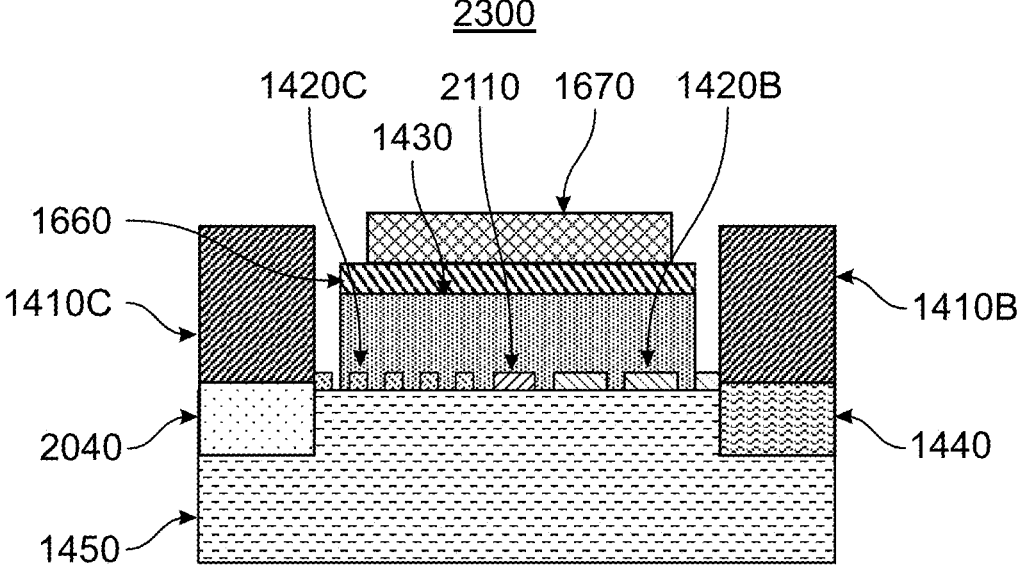
FIG. 23 illustrates a lateral gated infrared emitter employing δ-doped layers in accordance with one or more embodiments of the present invention.

FIGS. 22 and 23 illustrate lateral gated IR emitters 2200, 2300. The lateral gated IR emitter 2200 (FIG. 22) generally corresponds to a combination of the gated IR emitter 1600 (FIG. 16) and the lateral IR emitter 2000 (FIG. 20). In like manner, the lateral gated IR emitter 2300 (FIG. 23) generally corresponds to a combination of the gated IR emitter 1600 (FIG. 16) and the lateral IR emitter 2100 (FIG. 21).

Note that while not illustrated in FIGS. 20-23, a thin portion of the interlayer 1430, having, for example, a thickness of a few nanometers, would remain covering the phosphorous δ-doped layer 1420B and the boron δ-doped layer 1420C to keep the two δ-doped layers 1420B, 1420C from oxidizing and becoming nonconductive.

In other embodiments, the structure of the IR emitter 1400, the gated IR emitter 1500, the field effect IR emitter 1600, the IR emitter 1700, the IR emitters 1800, 1900, the lateral IR emitters 2000, 2100, or the lateral gated IR emitters 2200, 2300 may form the gain section of a laser. This offers the potential of creating an all silicon-based photonic integrated circuit without the need to heterogeneously integrate an emitter (gain region) formed of III-V semiconductor material.

In yet other embodiments, the structure of the IR emitter 1400, the gated IR emitter 1500, the field effect IR emitter 1600, the IR emitter 1700, the IR emitters 1800, 1900, the lateral IR emitters 2000, 2100, or the lateral gated IR emitters 2200, 2300 may form an IR photodetector as opposed to an IR emitter. Of particular interest would be placing the IR emitter 1400, the gated IR emitter 1500, the field effect IR emitter 1600, the IR emitter 1700, the IR emitters 1800, 1900, the lateral IR emitters 2000, 2100, or the lateral gated IR emitters 2200, 2300, in the guise of an IR photodetector, within a resonant cavity that would concentrate the optical field near one of the δ-doped layers to enhance photoresponse. The resonant cavity may include, for example, a metasurface and a reflective backplane as disclosed in U.S. Pat. No. 11,674,850B1. The structure of the field effect IR emitter 1600 may be of particular interest as the bias applied to the gate 1670 may cause the device to act as an avalanche photodetector (APD). Note that any (or all) of the IR emitter 1400, the gated IR emitter 1500, the field effect IR emitter 1600, the IR emitter 1700, the IR emitters 1800, 1900, the lateral IR emitters 2000, 2100, and/or the lateral gated IR emitters 2200, 2300 may be incorporated into an overall silicon-based photonic integrated circuit.

The following references describe potential applications of various embodiments of the present invention. T.-M. Lu et al., "Path Towards a Vertical TFET Enabled by Atomic Precision Advanced Manufacturing," Silicon Nanoelectronics Workshop, S5-6 (2021). X. Gao et al., "Modeling and Assessment of Atomic Precision Advanced Manufacturing (APAM) Enabled Vertical Tunneling Field Effect Transistor," International Conference on Simulation of Semicon-
ductor Processes and Devices, pp. 102-106 (2021).

All publications, including but not limited to patents and
patent applications, cited in this specification are herein
incorporated by reference as though set forth in their entirety
in the present application.

The invention may be embodied in other specific forms
without departing from its spirit or essential characteristics.
The described embodiments are to be considered in all
respects only as illustrative and not restrictive. The scope of
the invention is, therefore, indicated by the appended claims
rather than by the foregoing description. All changes which
come within the meaning and range of equivalency of the
claims are to be embraced within their scope.

What is claimed is:

1. A device, comprising:
a layer of a first material;
a first doped layer comprising a first dopant type, the first
doped layer adjacent the layer of the first material;
an interlayer of an indirect band gap material, the inter-
layer adjacent the first doped layer;
a second doped layer comprising a second dopant type,
the second doped layer adjacent the interlayer, the
second doped layer being a δ-doped layer;
a first electrical contact in contact with the first doped
layer; and
a second electrical contact in contact with the second
doped layer;
wherein a separation between the first doped layer and the
second doped layer is adapted to modify a band struc-
ture of the interlayer such that at least a portion of the
interlayer becomes a direct band gap material.

2. The device of claim 1, wherein:
the first doped layer is adjacent a first portion of the layer
of the first material;
the second doped layer is adjacent a second portion of the
layer of the first material; and
the second doped layer is laterally separated from the first
doped layer by a distance.

3. The device of claim 1, wherein the interlayer is located
between the first and second doped layers, thereby vertically
separating the first doped layer from the second doped layer.

4. The device of claim 1, wherein both the first and second
doped layers are δ-doped layers.

5. The device of claim 1, wherein the indirect band gap
material includes one or more of carbon, germanium, sili-
con, or germanium tin.

6. The device of claim 1, wherein the separation is
between 1 and 100 Å.

7. The device of claim 1, wherein:
each of the first dopant type and the second dopant type
is one of an n-type dopant or a p-type dopant; and
each of the n-type or p-type dopants includes at least one
of aluminum, antimony, arsenic, bismuth, boron, gal-
lium, indium, nitrogen, or phosphorus.

8. The device of claim 1, further comprising:
a second interlayer of a second indirect band gap material,
the second interlayer adjacent the second doped layer;
a third doped layer comprising the second dopant type, the
third doped layer adjacent the second interlayer, the
third doped layer being a δ-doped layer;
a third interlayer of a third indirect band gap material, the
third interlayer adjacent the third doped layer; and

16 a fourth doped layer comprising the second dopant type,
the fourth doped layer adjacent the third interlayer, the
fourth doped layer being a δ-doped layer;
wherein thicknesses of the second and third interlayers are
adapted to modify a corresponding band structure of
each of the second and third interlayers such that a
corresponding portion of each of the second and third
interlayers becomes a corresponding direct band gap
semiconductor material.

9. The device of claim 1, further comprising a third doped
layer comprising a third dopant type, the third doped layer
located within the interlayer, the third doped layer being a
δ-doped layer.

10. The device of claim 9, wherein the third dopant type
includes erbium or other rare earth element.

11. The device of claim 1, further comprising a third
doped layer comprising a third dopant type, the third doped
layer located adjacent a third portion of the layer of the first
material, the third doped layer laterally separated from the
first and second doped layers, the third doped layer being a
δ-doped layer.

12. The device of claim 11, wherein the third dopant type
includes erbium or other rare earth element.

13. The device of claim 1, further comprising:
a dielectric layer adjacent the second doped layer; and
a gate adjacent the dielectric layer, the gate adapted to
receive a bias and to thereby create a field in the
interlayer.

14. The device of claim 1, wherein the device is adapted
to implement a function of an optical emitter or a photode-
tector.

15. A device, comprising:
a layer of a first material;
a first doped layer comprising a first dopant type, the first
doped layer adjacent the layer of the first material, the
first doped layer being a δ-doped layer; and
an interlayer of an indirect band gap material, the inter-
layer adjacent the first doped layer;
wherein the first doped layer is adapted to modify a band
structure of the interlayer such that at least a portion of
the interlayer becomes a direct band gap material.

16. The device of claim 15, wherein the first dopant type
includes erbium or other rare earth element.

17. The device of claim 15, wherein:
the first dopant type is one of an n-type dopant or a p-type
dopant; and
the one of the n-type or p-type dopant includes at least one
of aluminum, antimony, arsenic, bismuth, boron, gal-
lium, indium, nitrogen, or phosphorus.

18. The device of claim 17, further comprising:
a dielectric layer adjacent the interlayer; and
a gate adjacent the dielectric layer, the gate adapted to
receive a bias and to thereby create a gate induced
carrier layer in the interlayer.

19. The device of claim 15, wherein the indirect band gap
material includes one or more of carbon, germanium, sili-
con, or germanium tin.

20. The device of claim 15, wherein the device is adapted
to implement a function of an optical emitter or a photode-
tector.

* * * * *